United States Patent
Kang

(10) Patent No.: US 6,995,998 B2
(45) Date of Patent: Feb. 7, 2006

(54) NONVOLATILE FERROELECTRIC MEMORY DEVICE HAVING A MULTI-BIT CONTROL FUNCTION

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 103 days.

(21) Appl. No.: 10/737,843

(22) Filed: Dec. 18, 2003

(65) Prior Publication Data
US 2005/0024914 A1    Feb. 3, 2005

(30) Foreign Application Priority Data
Jul. 30, 2003    (KR) ................. 10-2003-0052660

(51) Int. Cl.
*G11C 11/22*    (2006.01)
(52) U.S. Cl. .................. 365/145; 365/230.03
(58) Field of Classification Search ........... 365/145, 365/230.03
See application file for complete search history.

(56) References Cited

U.S. PATENT DOCUMENTS

| | | | |
|---|---|---|---|
| 6,067,244 A | 5/2000 | Ma et al. | |
| 6,272,594 B1 | 8/2001 | Gupta et al. | |
| 6,301,145 B1 | 10/2001 | Nishihara | |
| 6,314,016 B1 | 11/2001 | Takasu | |
| 6,363,439 B1 | 3/2002 | Battles et al. | |
| 6,850,447 B2 * | 2/2005 | Kang | 365/210 |

FOREIGN PATENT DOCUMENTS

KR    1020040059009 A    7/2004

* cited by examiner

*Primary Examiner*—Anh Phung
*Assistant Examiner*—Pho M. Luu
(74) *Attorney, Agent, or Firm*—Heller Ehrman LLP

(57) ABSTRACT

A nonvolatile ferroelectric memory device having a multi control function can amplify sensing voltage levels in a sensing critical voltage and determine a plurality of cell data when a plurality of reference timing strobes are applied on a basis of a time axis. In a read mode, a plurality of read data applied from a cell array block are stored in a read/write data register array unit through a common data bus unit. In a write mode, a plurality of read data stored in the read/write data register array unit or input data applied from a timing data buffer unit are stored in a cell array block through the common data bus unit. Here, since a plurality of sensing voltage levels are set in cell data, a plurality of sensed data bits can be stored in one cell.

15 Claims, 22 Drawing Sheets

NONVOLATILE FERROELECTRIC MEMORY DEVICE HAVING A MULTI-BIT CONTROL FUNCTION

BACKGROUND OF THE INVENTION

1. Field of the Invention

The present invention generally relates to a nonvolatile ferroelectric memory device having a multi-bit control function, and more specifically, to a technology for storing and sensing multi-bit data in a ferroelectric memory cell.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

In the conventional nonvolatile ferroelectric memory, a sensing reference voltage is set to have a proper level when cell data are sensed.

However, as a voltage for chip operation in the FeRAM becomes lower, the level of the reference voltage to sense a cell also becomes lower. When the sensing voltage level of the cell data is low, a voltage margin between the sensing voltage and the reference voltage is reduced. As a result, it is difficult to determine data. Also, a sensing margin is reduced by a voltage level change of the reference voltage. Therefore, it is difficult to obtain a rapid operation speed of the FeRAM chip having a 1T1C (1transistor, 1capacitor).

As a semiconductor memory device becomes smaller, the size of cell also becomes smaller. As a result, a technology for storing a plurality of multi-bit data in a cell is required to improve the efficiency of the cell size.

SUMMARY OF THE INVENTION

Accordingly, it is an object of the present invention to sense a plurality of data levels in a sensing critical voltage by differentiating a reference timing strobe interval and store a plurality of data bits in a cell.

It is another object of the present invention to store a plurality of read/written data through a register, thereby embodying a chip having an improved data access time.

It is still another object of the present invention to secure the margin of a sensing voltage and improve the operation speed in the embodiment of a chip having a low voltage or a rapid access time by amplifying a self-sensing voltage of cell data in a reference timing interval and judging a voltage level of data on a basis of a time axis.

In an embodiment, a nonvolatile ferroelectric memory device having a multi-bit control function comprises a plurality of cell array blocks, a read data bus unit, a read/write data register array unit and a write data bus unit. The plurality of cell array blocks amplify sensing data levels induced to a main bitline in a reference timing strobe interval. Here, each of the plurality of cell array blocks comprises a nonvolatile ferroelectric memory. The read data bus unit, connected in common to the plurality of cell array blocks, transmits the sensing data levels. The read/write data register array unit detects when the sensing data levels transmitted from the read data bus unit are changed to output a plurality of bit data corresponding to the sensing data levels, and converts a plurality of inputted bit data or the sensing data levels into analog reference level signals. The write data bus unit, connected in common to the plurality of cell array blocks, outputs the analog reference level signals into the plurality of cell array blocks.

In another embodiment, a nonvolatile ferroelectric memory device having a multi-bit control function comprises a plurality of cell array blocks and a read/write data register array unit. The read/write data register array unit detects when the levels of a plurality of sensing data transmitted from the plurality of cell array blocks are changed to output a plurality of bit data corresponding to the sensing data levels, and converts a plurality of inputted bit data or the sensing data levels into analog reference level signals. Here, each of the plurality of cell array blocks converts a self-sensing voltage of cell data on a basis of a time axis in a reference timing strobe interval, and amplifies voltage levels of a plurality of cell data in a critical value of a logic threshold voltage to output the plurality of sensing data levels.

DETAILED DESCRIPTION OF THE PREFERRED EMBODIMENTS

The present invention will be described in detail with reference to the accompanying drawings.

Figure 1:
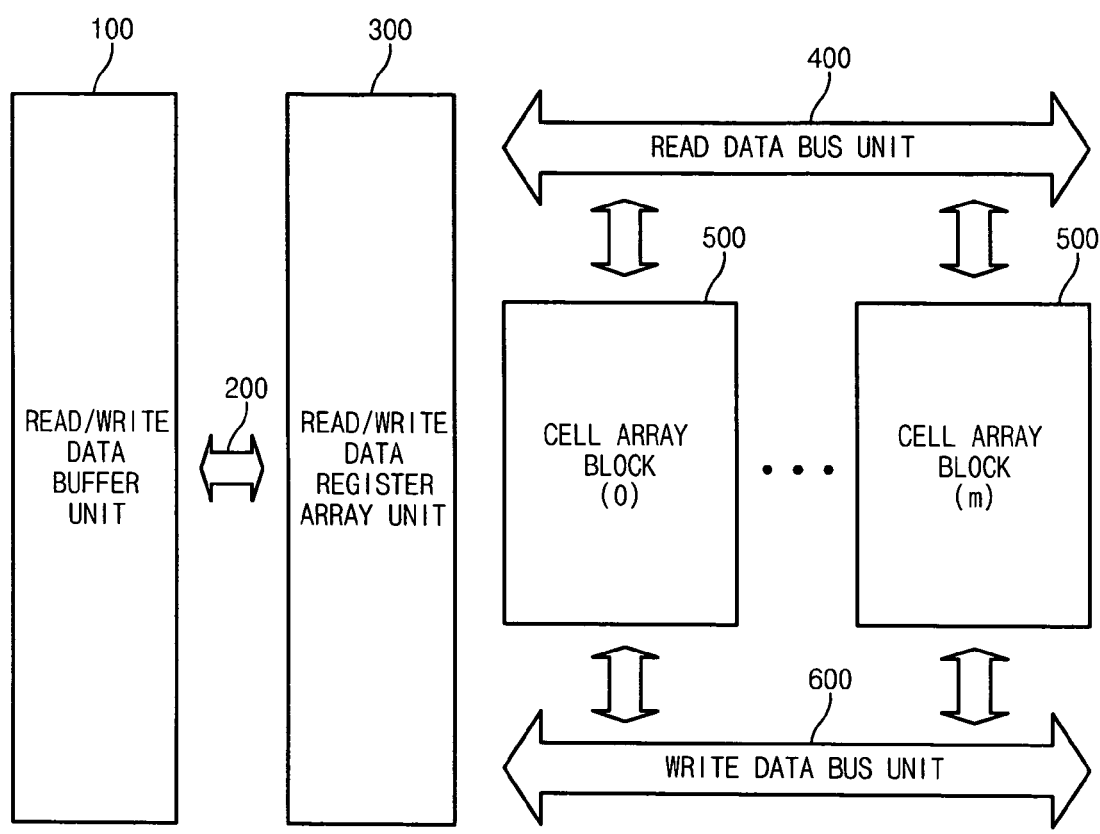
FIG. 1 is a diagram of a nonvolatile ferroelectric memory device having a multi-bit control function according to an embodiment of the present invention.

FIG. 1 is a diagram of a nonvolatile ferroelectric memory device having a multi-bit control function according to an embodiment of the present invention.

In an embodiment, the nonvolatile ferroelectric memory device comprises a read/write data buffer unit 100, a data buffer bus unit 200, a read/write data register array unit 300, a read data bus unit 400, a plurality of cell array blocks 500 and a write data bus unit 600.

The read/write data buffer unit 100 is connected to the read/write data register array unit 300 through the data buffer bus unit 200. The plurality of cell array blocks 500 share the read data bus unit 400 and the write data bus unit 600. The read data bus unit 400 and the write data bus unit 600 are connected to the read/write data register array unit 300.

In a read mode, data read from the cell array block 500 are stored in the read/write data register array unit 300 through the read data bus unit 400. The read data stored in the read/write data register array unit 300 are outputted into the read/write data buffer unit 100 through the data buffer bus unit 200.

In a write mode, input data inputted through the read/write data buffer unit 100 are stored in the read/write data register array unit 300 through the data buffer bus unit 200. The input data or read data stored in the read/write data register array unit 300 are written in the cell array block 500 through the write data bus unit 600.

Figure 2:
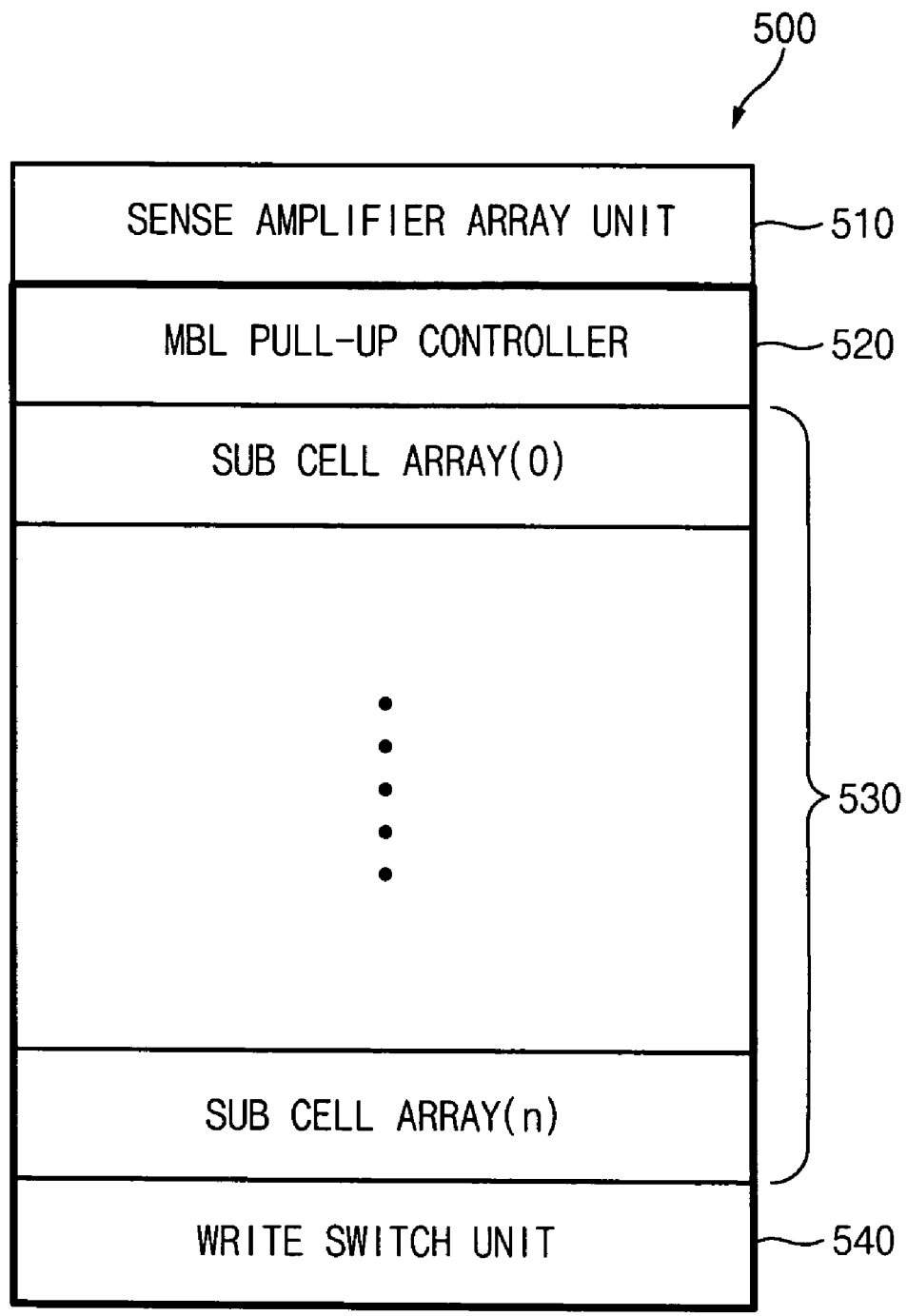
FIG. 2 is a diagram of a cell array block of FIG. 1.

FIG. 2 is a diagram of the cell array block 500 of FIG. 1.

The cell array block 500 comprises a sense amplifier array unit 510, a MBL (Main bitline) pull-up controller 520, a plurality of sub cell arrays 530 and a write switch unit 540.

The sense amplifier array unit 510 is connected to the read data bus unit 400, and the write switch unit 540 is connected to the write data bus unit 600.

Figure 3:
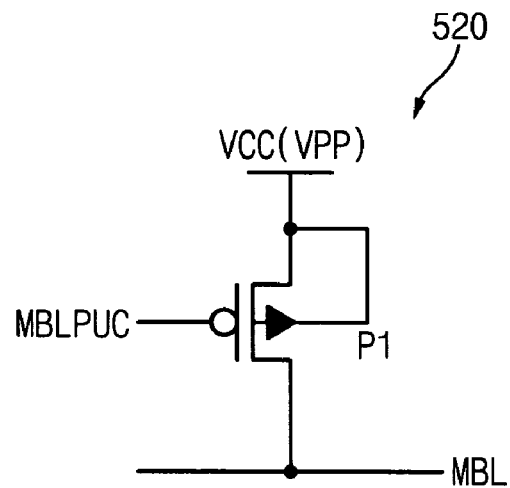
FIG. 3 is a circuit diagram of a MBL pull-up controller of FIG. 2.

FIG. 3 is a circuit diagram of the MBL pull-up controller 520 of FIG. 2.

The MBL pull-up controller 520 comprises a PMOS transistor P1 for pulling up a main bitline MBL in a precharge mode. The PMOS transistor P1 has a source connected to a power voltage VCC(or VPP) terminal, a drain connected to the main bitline MBL and a gate to receive a main bitline pull-up control signal MBLPUC.

Figure 4:
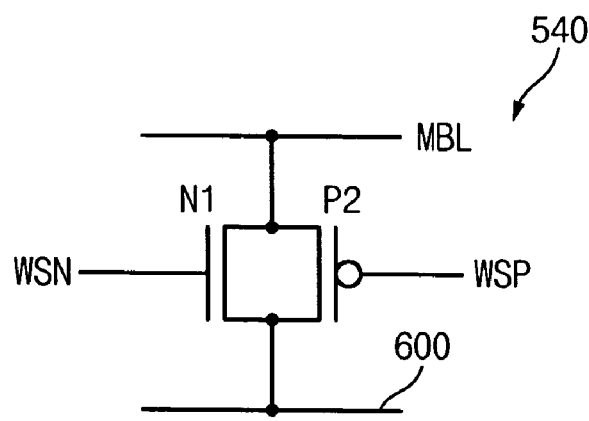
FIG. 4 is a circuit diagram of a write switch unit of FIG. 2.

FIG. 4 is a circuit diagram of a write switch unit 540 of FIG. 2.

The write switch unit 540 comprises an NMOS transistor N1 and a PMOS transistor P2. The NMOS transistor N1, connected between the main bitline MBL and the write data bus unit 600, has a gate to receive a write switch control signal WSN. The PMOS transistor P2, connected between the main bitline MBL and the write data bus unit 600, has a gate to receive a write switch control signal WSP.

The write switch unit 540 is used only in the write mode and kept turned off in the read mode. In the read mode, amplified data of the sense amplifier array unit 510 are outputted into the read data bus unit 400.

Figure 5:
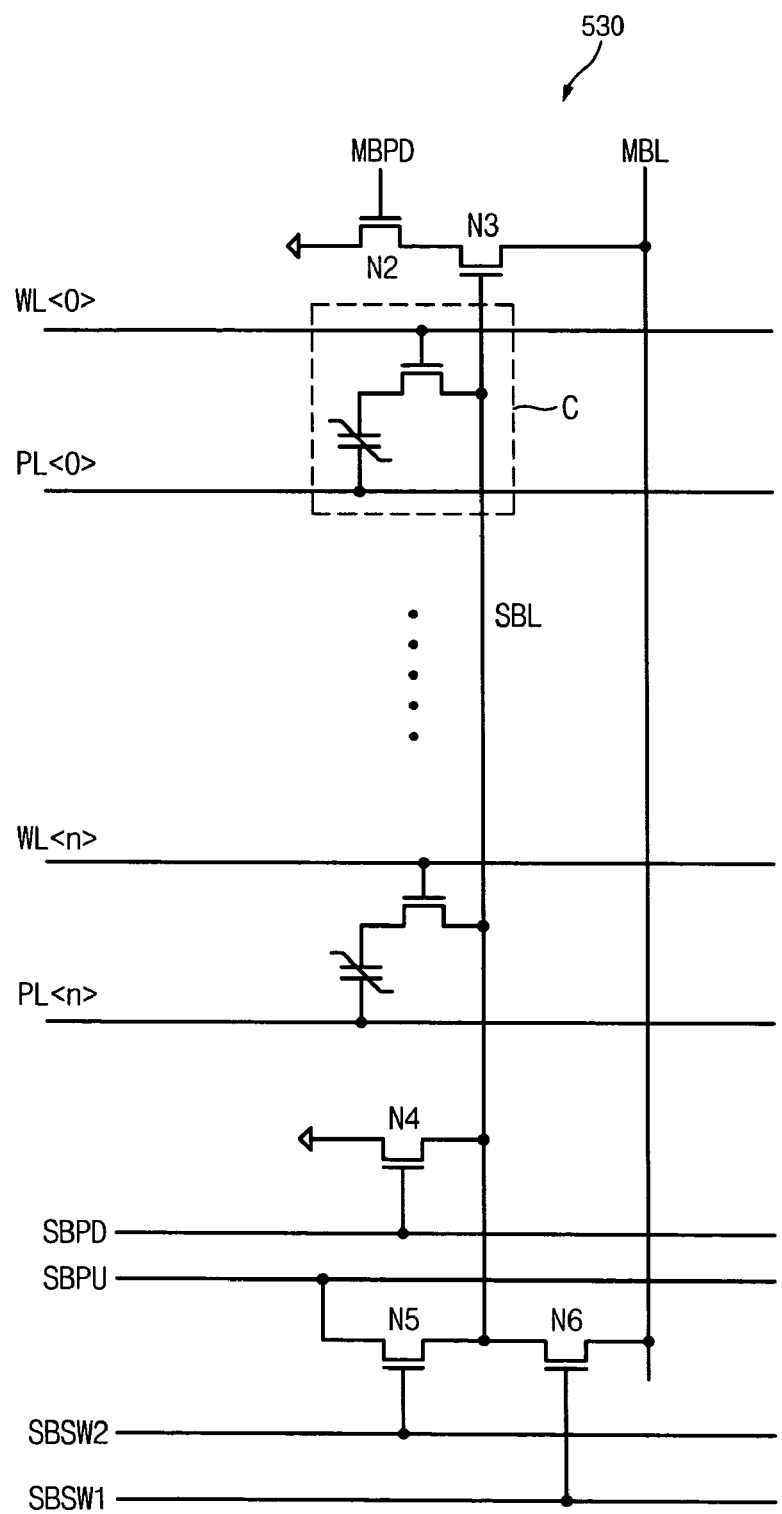
FIG. 5 is a circuit diagram of a sub cell array of FIG. 2.

FIG. 5 is a circuit diagram of the sub cell array 530 of FIG. 2.

Each main bitline MBL of the sub cell array 530 is selectively connected to one of a plurality of sub bitlines SBL. When a sub bitline selecting signal SBSW1 is activated, an NMOS transistor N6 is turned on, thereby activating a sub bitline SBL. One sub bitline SBL is connected to a plurality of cells C.

The sub bitline SBL is pulled down to a ground level in response to a sub bitline pull-down signal SBPD when an NMOS transistor N4 is turned on. The sub bitline pull-up signal SBPU is to control power supplied to the sub bitline SBL. In a low voltage, a voltage higher than the power voltage VCC is supplied to the sub bitline SBL.

An NMOS transistor N5 controls connection between a sub bitline pull-up signal SBPU terminal and the sub bitline SBL in response to a sub bitline selecting signal SBSW2.

An NMOS transistor N3, connected between an NMOS transistor N2 and the main bitline MBL, has a gate connected to the sub bitline SBL. The NMOS transistor N2, connected between a ground voltage terminal and the NMOS transistor N3, has a gate to receive a main bitline pull-down signal MBPD, thereby regulating a sensing voltage of the main bitline MBL.

Figure 6:
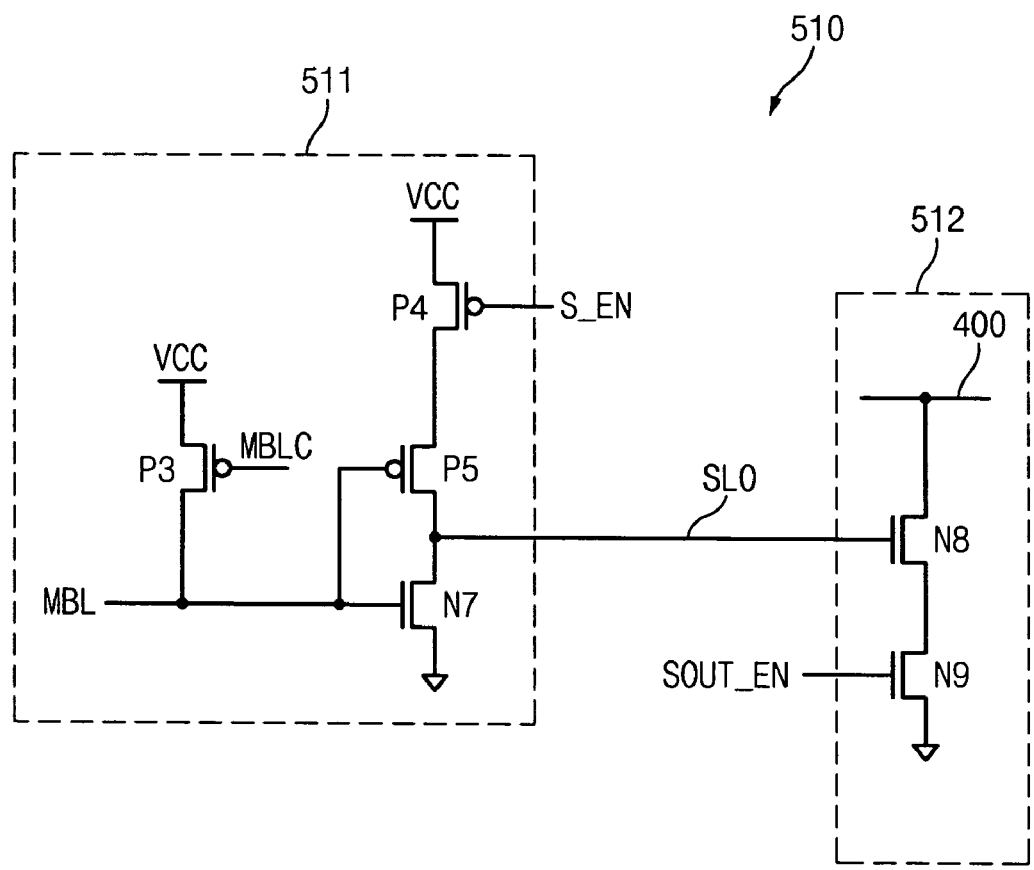
FIG. 6 is a circuit diagram of a sense amplifier array unit of FIG. 2.

FIG. 6 is a circuit diagram of the sense amplifier array unit 510 of FIG. 2.

The sense amplifier array unit 510 comprises a level sensing unit 511 and a sensing output unit 512.

The level sensing unit 511 comprises PMOS transistor P3~P5, and an NMOS transistor N7. The PMOS transistor P3, connected between the power voltage VCC terminal and the main bitline MBL, has a gate to receive a main bitline control signal MBLC. The PMOS transistor P4, connected between the power voltage VCC terminal and the PMOS transistor P5, has a gate to receive a sensing enable signal S_EN.

The PMOS transistor P5, connected between the PMOS transistor P4 and a node SLO, has a gate connected to the main bitline MBL. The NMOS transistor N7, connected between the node SLO and the ground voltage terminal, has a gate connected to the main bitline MBL.

The sensing output unit 512 comprises NMOS transistors N9 and N10 connected serially between the read data bus unit 400 and the ground voltage terminal. An NMOS transistor N8, connected between the read data bus unit 400 and the NMOS transistor N9, has a gate connected to the node SLO. The NMOS transistor N9, connected between the NMOS transistor N8 and the ground voltage terminal, has a gate to receive a sensing output enable signal SOUT_EN.

The NMOS transistor N8 buffers an output voltage of the node SLO on a basis of the logic threshold voltage Vt.

Hereinafter, the operation of the sense amplifier array unit 510 is described.

In a normal mode, the PMOS transistor P4 of the level sensing unit 511 is kept turned off. In the read mode, if the sensing enable signal S_EN becomes at a low level, the PMOS transistor P5 is turned on to apply power voltage to the PMOS transistor P5.

A gate of the NMOS transistor N7 and the PMOS transistor P5 is connected to the main bitline MBL. As a result, a voltage level outputted to the node SLO is determined by a voltage of the main bitline MBL. When the main bitline control signal MBLC is at a low level, the PMOS transistor P3 outputs the power voltage VCC into the main bitline MBL.

When the main bitline MBL is over a critical voltage VCC, the NMOS transistor N7 is turned on, and the node SLO becomes at a low level. When the main bitline control signal MBLC is at a high level, the main bitline MBL becomes at a low level and the PMOS transistor P5 is turned on. As a result, the node SLO becomes at a high level.

The NMOS transistor N9 is kept turned off in the normal mode. In the read mode, if the sensing output enable signal SOUT_EN is enabled to a high level, the NMOS transistor N9 is turned on. A voltage level of the read data bus unit 400 is determined depending on the voltage level of the node SLO.

The read data bus unit 400 is maintained at a precharge state to a high level by a read bus pull-up unit. The NMOS transistor N8 is switched by the voltage level of the node SLO, and determines a pull-down operation of the read data bus unit 400. When the voltage level of the node SLO is at a high level, the NMOS transistor N9 is turned on to pull down the read data bus unit 400 to a low level. On the other hand, when the voltage level of the node SLO is at a low level, the data bus unit 400 is maintained at a high level.

Figure 7:
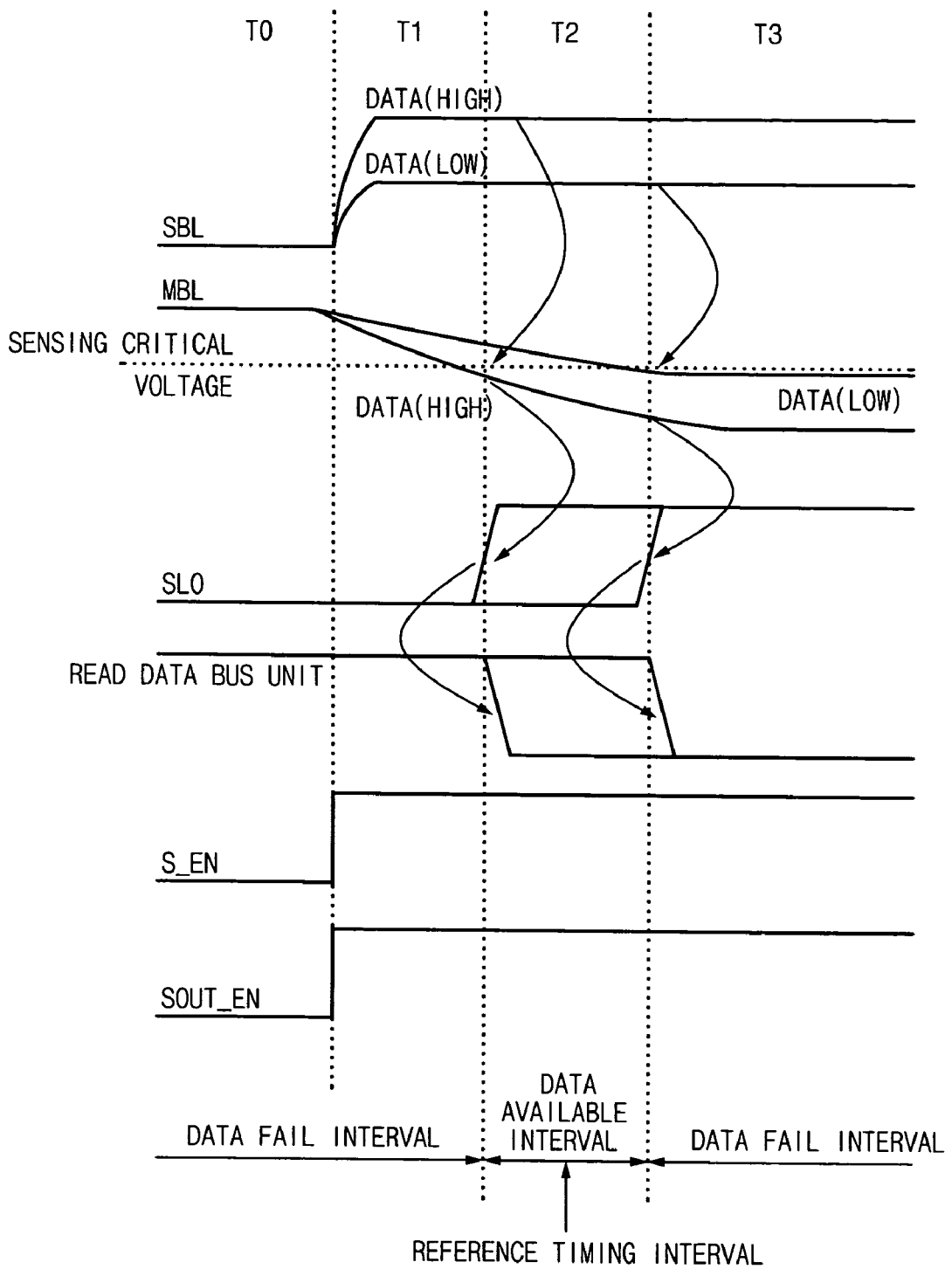
FIG. 7 is a timing diagram illustrating the operation of the sense amplifier array unit of FIG. 6.

FIG. 7 is a timing diagram illustrating the operation of the sense amplifier array unit 510 of FIG. 6.

In an interval T0, a wordline WL and a plateline PL are inactivated, and the main bitline MBL and the read data bus unit 400 are precharged to a high level. Here, the sub bitline SBL and the node SLO are precharged to a low level. The sensing enable signal S_EN and the sensing output enable signal SOUT_EN are at a disable state.

In an interval T1, the wordline WL and the plateline PL are activated to a high level. Cell data "high" or "low" are applied to the sub bitline SBL and the main bitline MBL.

The sensing enable signal S_EN and the sensing output enable signal SOUT_EN which are control signals of the sense amplifier are activated to a high level. The sense amplifier array unit 510 performs a data amplifying and sensing operation. Here, the voltage level of the main bitline MBL is reduced to the sensing critical voltage level.

In an interval T2, a voltage level of cell data "high" reaches a sensing critical voltage earlier than that of cell data "low". The voltage of the node SLO reaches the logic threshold voltage Vt level of the NMOS transistor N8 when the cell data is "high" earlier than when the cell data is "low". As a result, the voltage level of the node SLO transits to a high level to output a low level to the read data bus unit 400. In the interval T2, the voltage level of the cell data "low" does not reach the sensing critical voltage level.

When the cell data "high" and "low" each reach the sensing critical voltage level, the sensing critical voltage has a time difference for the interval T2 on a basis of a time axis. During the interval T2 as a reference timing strobe interval, cell data "high" or "low" are determined, thereby judging availability of cell data. Here, in the reference timing strobe interval, a read lock control signal R_LOCK of the data register 302 determines whether cell data are high or low.

In the reference timing strobe interval T2, when the voltage level of the read data bus unit 400 is low, cell data shows "high". On the other hand, in the interval T2, when the voltage level of the data bus unit 400 is "high", cell data shows "low".

In an interval T3, when cell data is "low", the voltage level of the node SLO reaches the voltage level of the logic threshold voltage Vt. In the interval T3, the voltage level of the node SLO is enabled to a high level regardless of voltage levels of cell data "high" or "low". As a result, the voltage level of the read data bus unit 400 is disabled to a low level.

Figure 8:
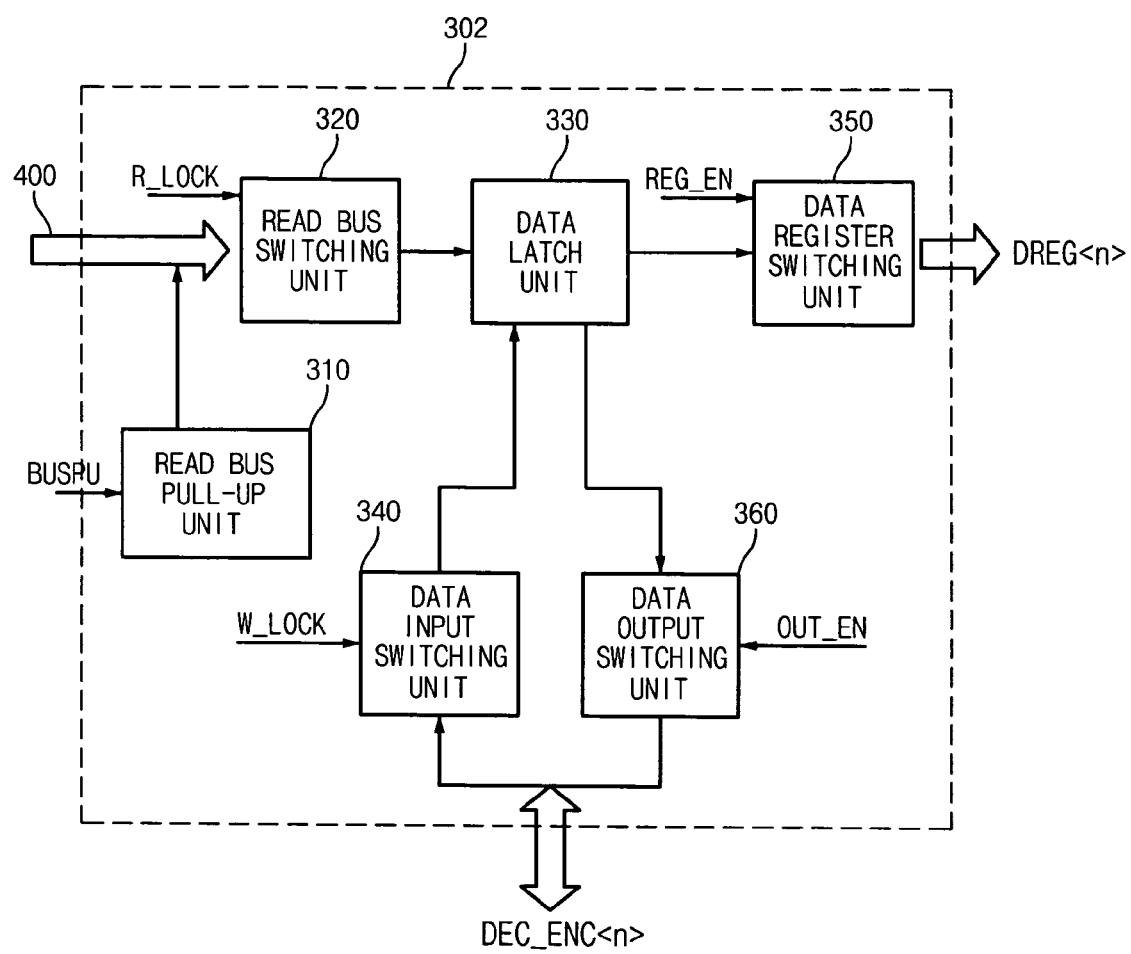
FIG. 8 is a diagram of a data register in a read/write data register array unit of FIG. 1.

FIG. 8 is a diagram of the data register 302 in the read/write data register array unit 300 of FIG. 1.

The data register 302 comprises a read bus pull-up unit 310, a read bus switching unit 320, a data latch unit 330, a data input switching unit 340, a data register switching unit 350 and a data output switching unit 360.

The read bus pull-up unit 310 pulls up the read data bus unit 400 from an initial stage in response to a bus pull-up control signal BUSPU. The read bus switching unit 320 outputs data applied from the read data bus unit 400 into the latch unit 330 in response to a read lock control signal R_LOCK.

The data latch unit 330 stores read data applied from the read bus switching unit 320 and input data applied from the data input switching unit 340. The data input switching unit 340 outputs a coding signal DEC_ENC<n> applied from a decoder into the data latch unit 330 in response to a write lock control signal W_LOCK.

The data register switching unit 350 outputs data stored in the data latch unit 330 into a D/A converter as data register signals DREG<n> in response to a register enable signal REG_EN. The data output switching unit 360 outputs coding signals DEC_ENC<n> into an encoder in response to an output enable signal OUT_EN.

Figure 9:
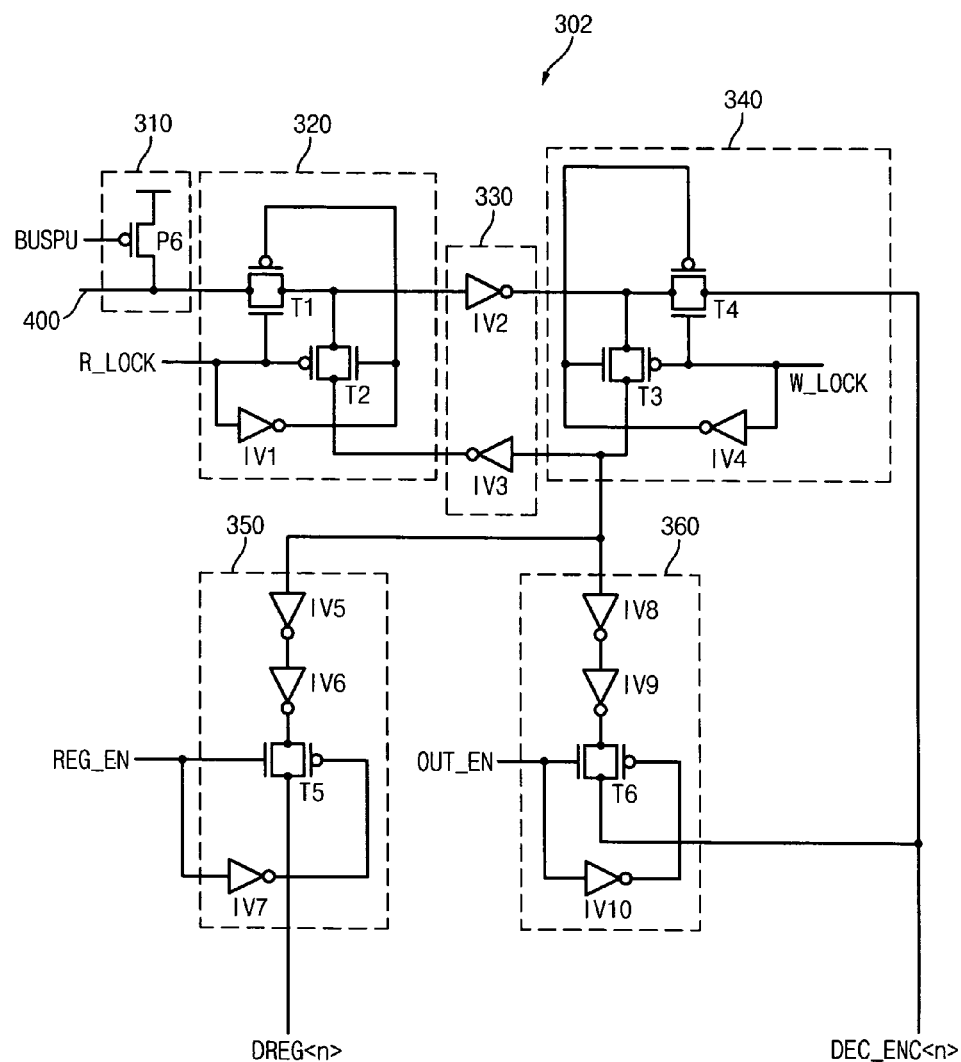
FIG. 9 is a circuit diagram of the data register of FIG. 8.

FIG. 9 is a circuit diagram of the data register 302 of FIG. 8.

The read bus pull-up unit 310 comprises a PMOS transistor P6. The PMOS transistor P6, connected between a power voltage terminal and the read data bus unit 400, has a gate to receive a bus pull-up control signal BUSPU.

The read bus switching unit 320 comprises transmission gates T1 and T2, and an inverter IV1. The inverter IV1 inverts a read lock control signal R_LOCK. The transmission gate T1 selectively outputs read dada applied from the read data bus unit 400 in response to the read lock control signal R_LOCK. The transmission gate T2 selectively outputs an output signal from the inverter IV3 in response to the read lock control signal R_LOCK.

The data latch unit 330 comprises inverters IV2 and IV3 connected with a latch type. The data input switching unit 340 comprises an inverter IV4 and transmission gates T3 and T4. The inverter IV4 inverts a write lock control signal W_LOCK.

The transmission gate T3 selectively outputs an output signal from the inverter IV2 in response to the write lock control signal W_LOCK. The transmission gate T4 selectively outputs coding signals DEC_ENC<n> into the data latch unit 330 in response to the write lock control signal W_LOCK.

The data register switching unit 350 comprises inverters IV5~IV7, and a transmission gate T5. The inverters IV5 and IV6 non-invert and delay an output signal from the transmission gate T3. The inverter IV7 inverts a register enable signal REG_EN. The transmission gate T5 outputs an output signal from the inverter IV6 as register signals DREG<n> in response to the register enable signal REG_EN.

The data output switching unit 360 comprises inverters IV8~IV10, and a transmission gate T6. The inverters IV8 and IV9 non-invert and delay an output signal from the transmission gate T3. The inverter IV10 inverts an output enable signal OUT_EN. The transmission gate T6 outputs an output signal from the inverter IV9 as coding signals DEC_ENC<n> in response to the output enable signal OUT_EN.

Figure 10:
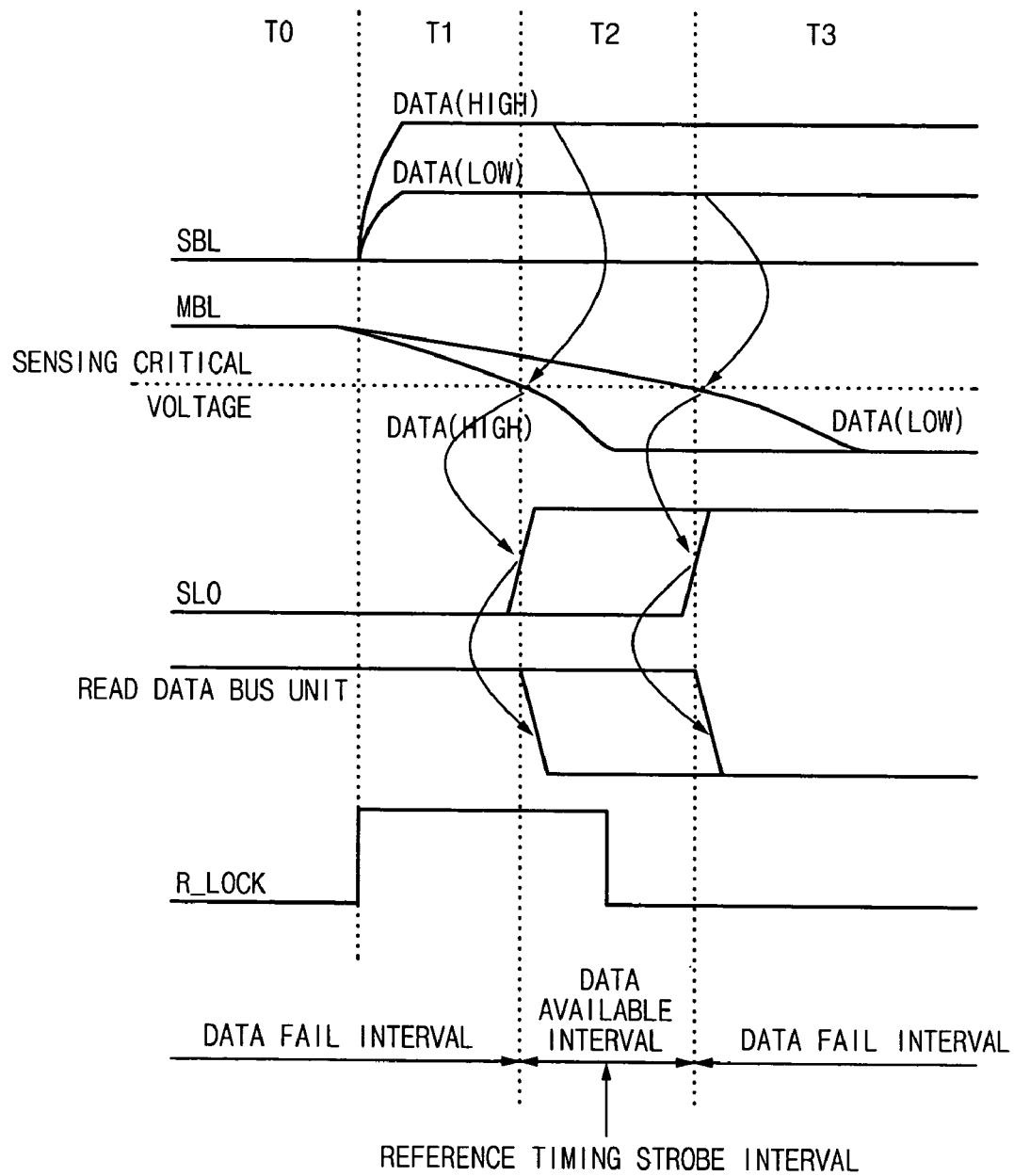
FIG. 10 is a timing diagram of the data register of FIG. 8.

FIG. 10 is a timing diagram of the data register 302 of FIG. 8.

In an interval T1, if the read lock control signal R_LOCK is enabled, cell sensing data applied from the read data bus unit 400 are stored in the data latch unit 330. While the read lock control signal R_LOCK is at a high level, read data are continuously stored in the data latch unit 330. Here, the write lock control signal W_LOCK becomes at a low level to turn on the transmission gate T3 and turn off the transmission gate T4, thereby preventing new data from being inputted into the data latch unit 330.

In an interval T2, if the read lock control signal R_LOCK transits to a low level, read data are no longer inputted into the data latch unit 330. As a result, data previously stored in the data latch unit 330 are continuously maintained when the read lock control signal R_LOCK is disabled in the reference timing strobe interval T2.

In an interval T3, since the voltage levels of cell data "high" or "low" are all at a low level, read data are no longer inputted into the data latch unit 330. Data inputted for a data available interval of the reference timing strobe interval T2 are stored in the data latch unit 330.

Figure 11:
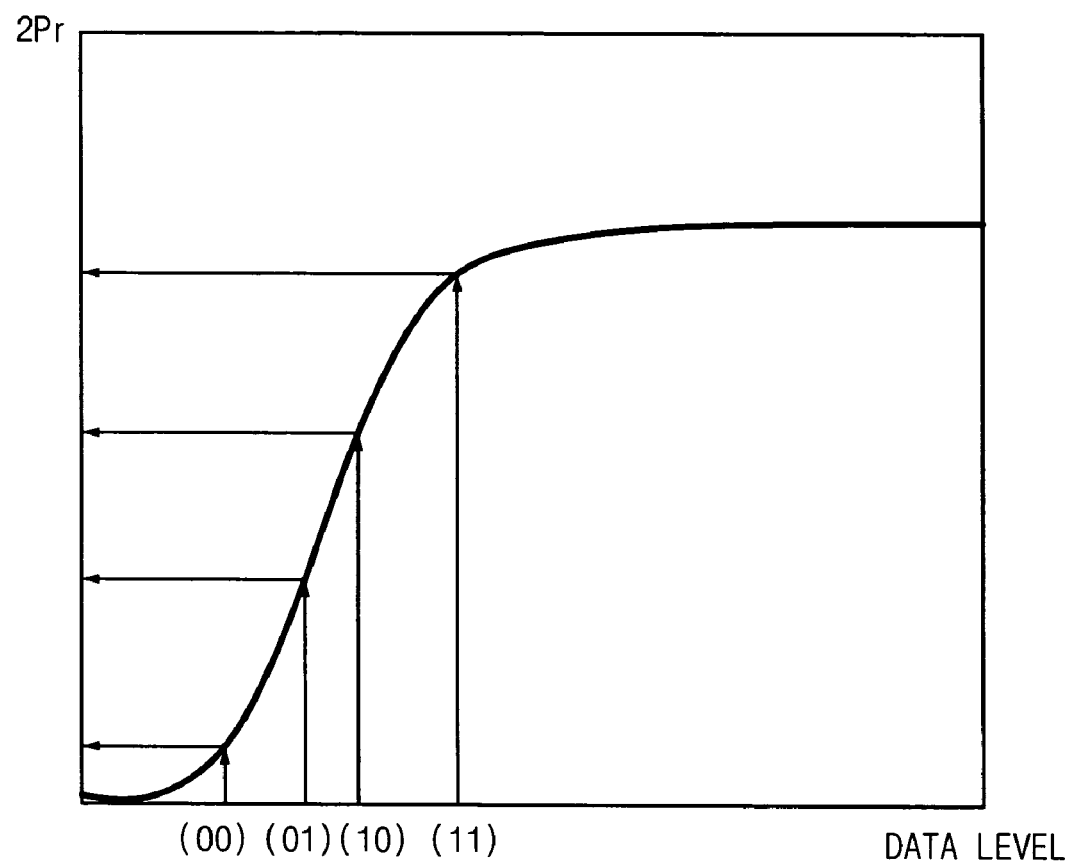
FIGS. 11 and 12 are diagrams illustrating the multi-data level.
Figure 12:
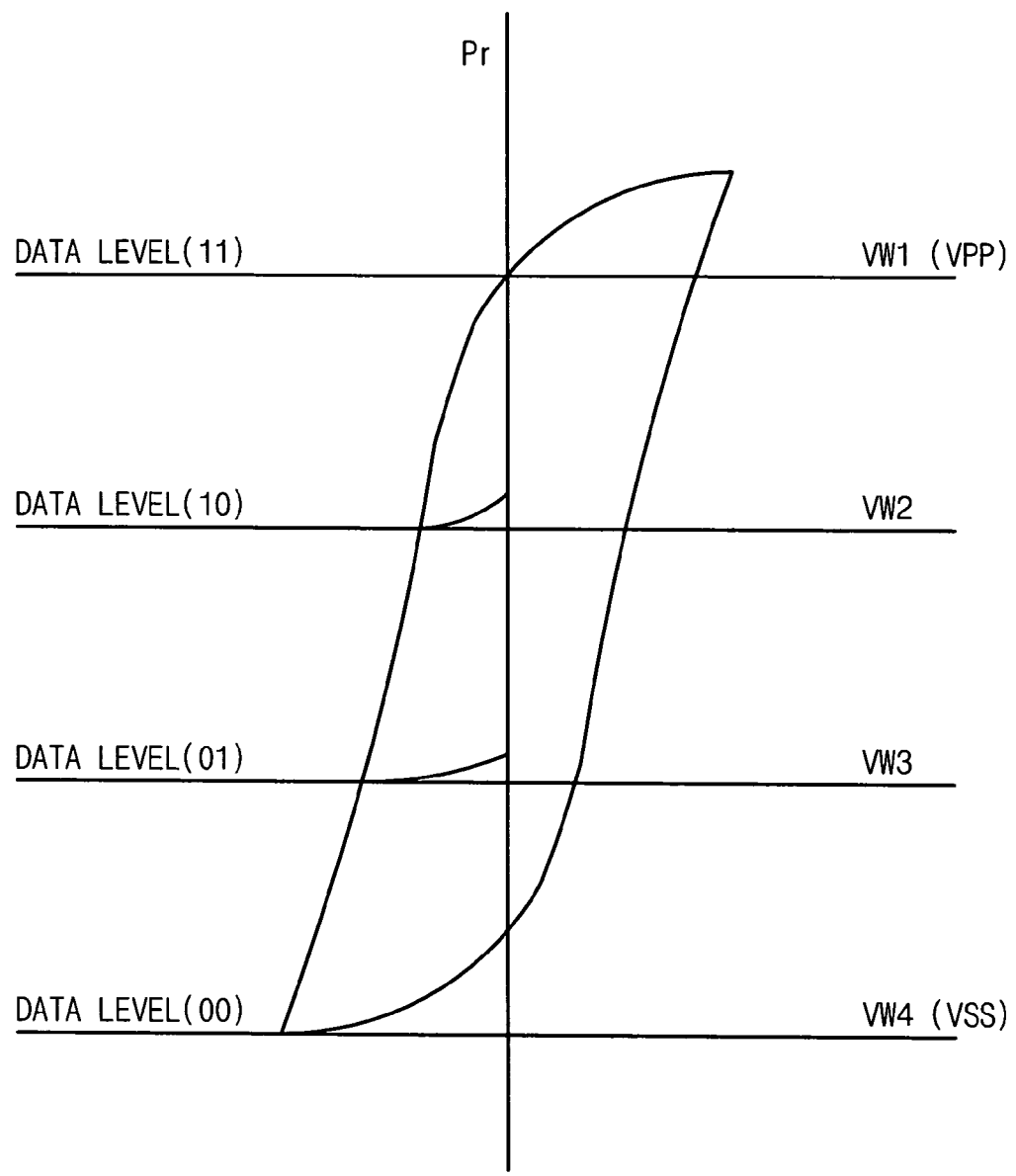

FIGS. 11 and 12 are diagrams illustrating a 2 bit recording level according to an embodiment of the present invention.

$4(2^2)$ level data is required to store 2 bits in a memory cell. That is, data levels of 00, 01, 10 and 11 are required. Thus, in order to store data of four levels in a cell, a voltage level is divided into VW1 (VPP), VW2, VW3 and VW4 (VSS), and stored.

Hereinafter, the write operation of 2 bit data is described.

If a VW1(VPP) voltage is applied to a cell while the plateline PL is at the ground voltage VSS level, hidden data "1" is written in all cells.

Next, when a pumping voltage VPP is applied to the plateline PL, a voltage VW2 is applied to the sub bitline SBL and the main bitlines MBL to store a data level 10. As a result, a voltage VW1–VW2 is applied to the plateline PL and the sub bitline SBL. That is, the charge initially stored in the cell is reduced to that corresponding to the voltage VW1–VW2. Thus, a data level 11 transits to the data level 10.

Thereafter, data levels 01 and 00 are stored in the cell by applying different voltages VW3 and VW4 to the sub bitline SBL and the main bitline MBL.

Figure 13:
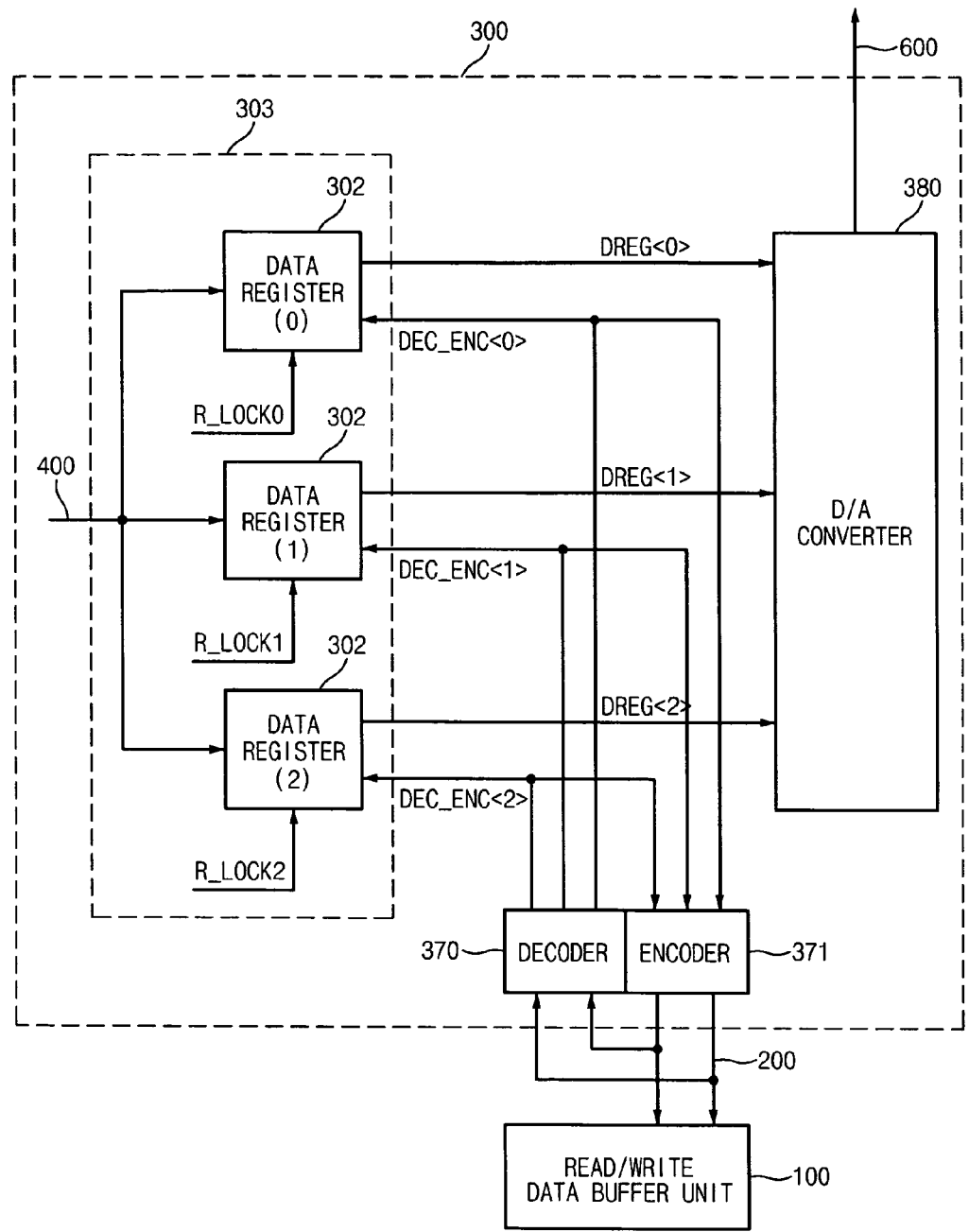
FIG. 13 is a circuit diagram of the read/write data register array unit of FIG. 1.

FIG. 13 is a circuit diagram of the read/write data register array 300 unit of FIG. 1.

The read/write data register array unit 300 comprises a data register array unit 303, a decoder 370, an encoder 371 and a D/A (Digital/Analog) converter 380.

The data register array unit 303 comprises a plurality of data registers 302. A plurality of sensing data levels applied from the read data bus unit 400 are latched and stored in response to the read lock control signals R_LOCK0~R_LOCK2. The data register array unit 303 outputs data register signals DREG<0:2> into the D/A converter 380 in response to the register enable signal REG_EN. The data register array unit 303 stores coding signals DEC_ENC<0:2> applied from the decoder 370, and outputs coding signals DEC_ENC<0:2> stored in the encoder 371.

The data register array unit 303 comprises the three data register 302 to process 2 bit data. Four data sensing levels are compared with the read lock control signals R_LOCK0~R_LOCK2 representing three reference timings, and the comparison results are stored in the three data register 302.

The decoder 370 decodes input data applied from the read/write data buffer unit 100 through the data buffer bus unit 200, and outputs coding signals DEC_ENC<0:2> into the data register array unit 303. The encoder 371 encodes the coding signals DEC_ENC<0:2> applied from the data register array unit 303, and outputs the encoded signals into the read/write data buffer unit 100 through the data buffer bus unit 200.

The D/A converter 380 converts the data register signals DREG<0:2> applied from the data register array unit 303 into analog signals, and outputs the converted analog signals into the write data bus unit 600.

Figure 14:
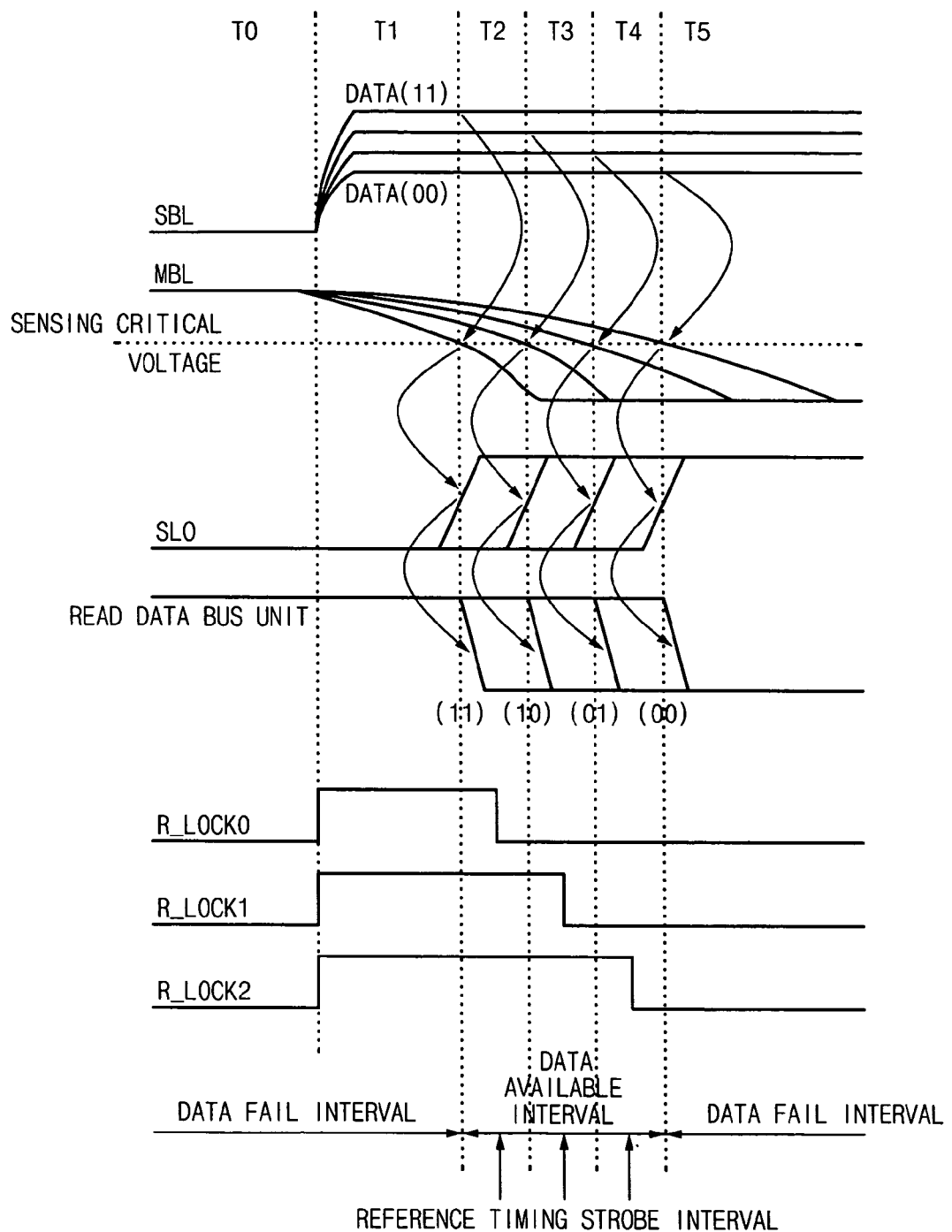
FIG. 14 is a timing diagram illustrating the operation of the read/write data register array unit of FIG. 13.

FIG. 14 is a timing diagram illustrating the operation of the read/write data register array unit 300 of FIG. 13.

In an interval T1, if the read lock control signals R_LOCK0~R_LOCK2 are enabled, a plurality of cell sensing data 00,01,10 and 11 applied from the read data bus unit 400 are applied into the data latch unit 330. While the read lock control signals R_LOCK0~R_LOCK2 are at a high level, read data having a plurality of sensing levels are continuously stored in the data latch unit 330.

A plurality of data sensing levels of the sub bitline SBL are divided into a plurality of main bitline MBL signals. Voltage levels of the cell sensing data 00,01,10,11 have time differences in a reference timing strobe interval in the main bitline MBL.

The cell data 11, 10, 01 and 00 sequentially reach the sensing critical voltage level. The voltage level of the node SLO is outputted as a low level into the read data bus unit 400 as the cell data 11,10,01 and 00 sequentially transit to a high level.

During the reference timing strobe intervals T2~T4, the read lock control signals R_LOCK0~R_LOCK2 to determine cell data are disabled to a low level with a predetermined time interval, respectively, thereby determining a plurality of cell data.

The read lock control signal R_LOCK0 is generated between the cell data 11 and 10, and the read lock control signal R_LOCK1 is generated between the cell data 10 and 01. The read lock control signal R_LOCK2 is disabled to a low level between the cell data 01 and 00. As a result, during the reference timing strobe intervals T2~T4, data when the read lock control signals R_LOCK0~R_LOCK2 are disabled are stored in the three data registers 302.

If the read lock control signals R_LOCK0~R_LOCK2 transit to a low level, the read data are no longer inputted into the data latch unit 330. In the reference timing strobe interval, data previously stored in the data latch unit 330 are continuously maintained when the read lock control signals R_LOCK0~R_LOCK2 are disabled.

Thereafter, in an interval T5, the voltage levels of the node SLO are enabled to a high level regardless of voltage levels of a plurality of cell data. As a result, the voltage levels of the read data bus unit 400 are disabled to a low level.

Figure 15:
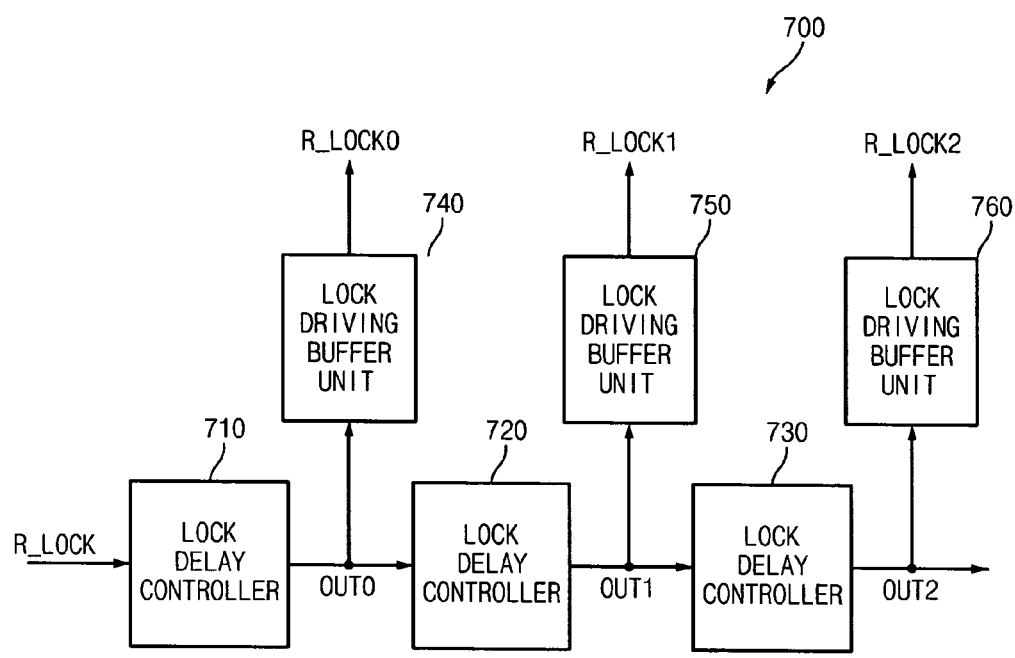
FIG. 15 is a diagram of a read lock control signal according to an embodiment of the present invention.

FIG. 15 is a diagram of a read lock control signal generator 700 for generating a plurality of read lock control signals R_LOCK0~R_LOCK2 according to an embodiment of the present invention.

The read lock control signal generator 700 comprises a plurality of lock delay controllers 710~730 and a plurality of lock driving buffer units 740~760.

The plurality of lock delay controllers 710 delay the read lock control signals R_LOCK with different delay time to output a plurality of output signals OUT0~OUT2. The lock driving buffer unit 740 drives an output signal OUT0 having the shortest delay time to output the read lock control signal R_LOCK0 into the data register(0) 302. The lock driving buffer unit 750 drives the output signal OUT1, and outputs the read lock control signal R_LOCK1 into the data register (1) 302. The lock driving buffer unit 760 drives the output signal OUT2 having the longest delay time, and outputs the read lock control signal R_LOCK2 into the data register(2) 302.

Figure 16:
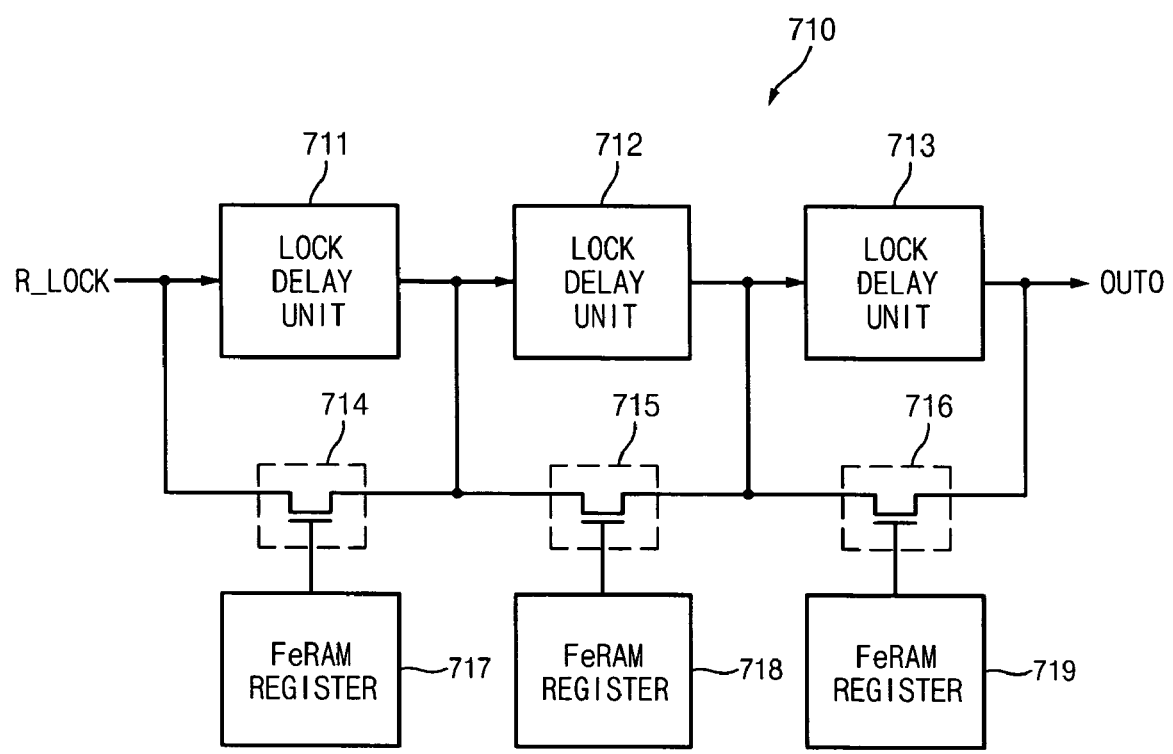
FIG. 16 is a diagram of a lock delay controller of FIG. 15.

FIG. 16 is a diagram of the lock delay controllers 710~730 of FIG. 15.

Since the plurality of lock delay controllers 710~730 have the same structure, the lock delay controller 710 is exemplified.

The lock delay controller 710 comprises a plurality of lock delay units 711~713, a plurality of transmission switching units 714~716, and a plurality of FeRAM registers 717~719.

The plurality of lock delay units 711~713 delay read lock control signals LOCK with different delay time, and output the output signal OUT0 delayed for a predetermined time. The plurality of transmission switching units 714~716 are switched depending on of the plurality of FeRAM registers 717~719 to control connection of the lock delay units 711 and 712.

The plurality of FeRAM registers 717~719 program a code on a preset command signal, and output a control signal to control the switching state of the plurality of transmission switching units 714~716 depending on the program code.

Figure 17:
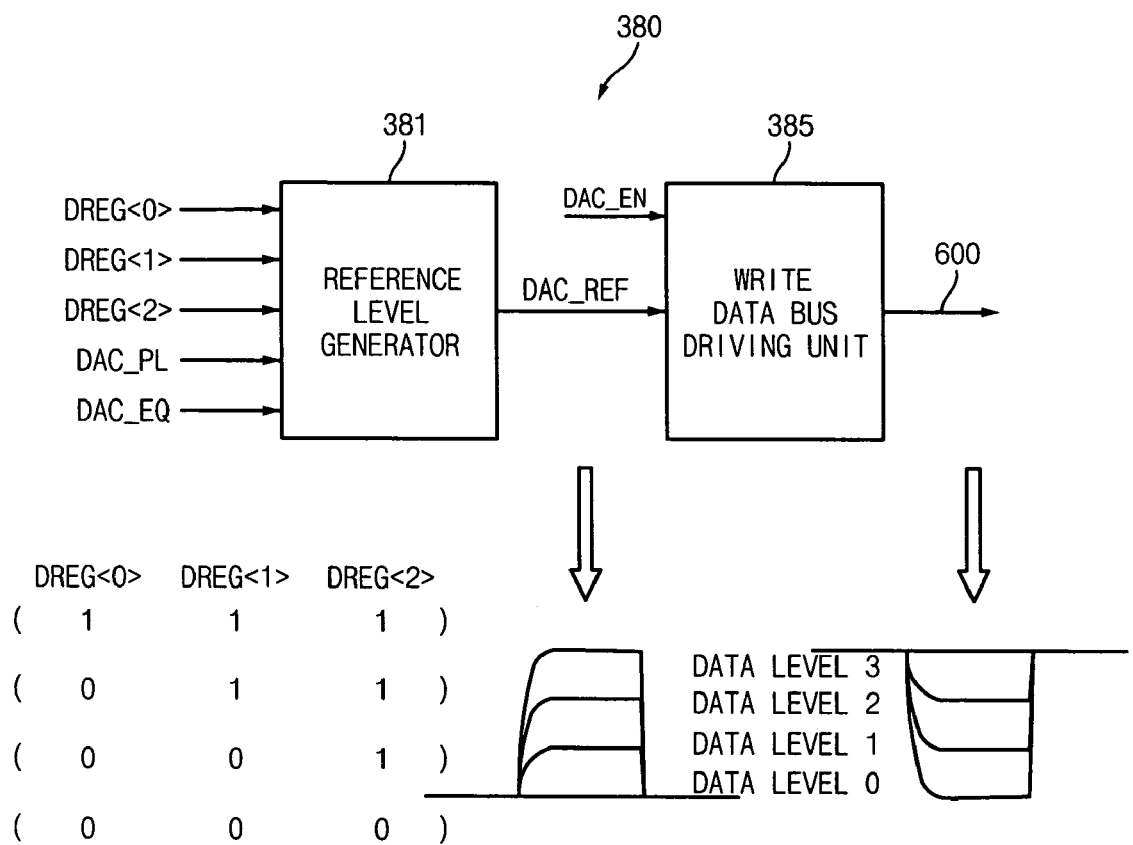
FIG. 17 is a diagram of a D/A converter of FIG. 13.

FIG. 17 is a diagram of the D/A converter 380 of FIG. 13.

The D/A converter 380 comprises a reference level generator 381 and a write data bus driver 385.

The reference level generator 381 outputs a reference level signal DAC_REF in response to a plurality of data register signals DREG<0:2> applied from the data register array unit 303, a plateline control signal DAC_PL and an equalizing signal DAC_EQ. The reference level generator 381 generates 4 cell writing voltage levels using the three data register signals DREG<0:2> to process 2 bit data.

When the data register signals DREG<0:2> are all "1", the reference level generator 381 outputs the reference level signal DAC_REF having a data level "3". When the data register signal DREF<0> is "0" and the data register signals DREF<1> and DREF<2> are "1", the reference level generator 381 outputs the reference level signal DAC_REF having a data level "2".

When the data register signal DREF<2> is "1" and the data register signals DREF<0> and DREF<1> are "0", the reference level generator 381 outputs the reference level signal DAC_REF having a data level "1". When the data register signals DREF<0:2> are all "0", the reference level generator 381 outputs the reference level signal DAC_REF having a data level "0".

The write data bus driving unit 385 drives the reference level signals DAC_REF, and outputs the driven signal into the write data bus unit 600.

Figure 18:
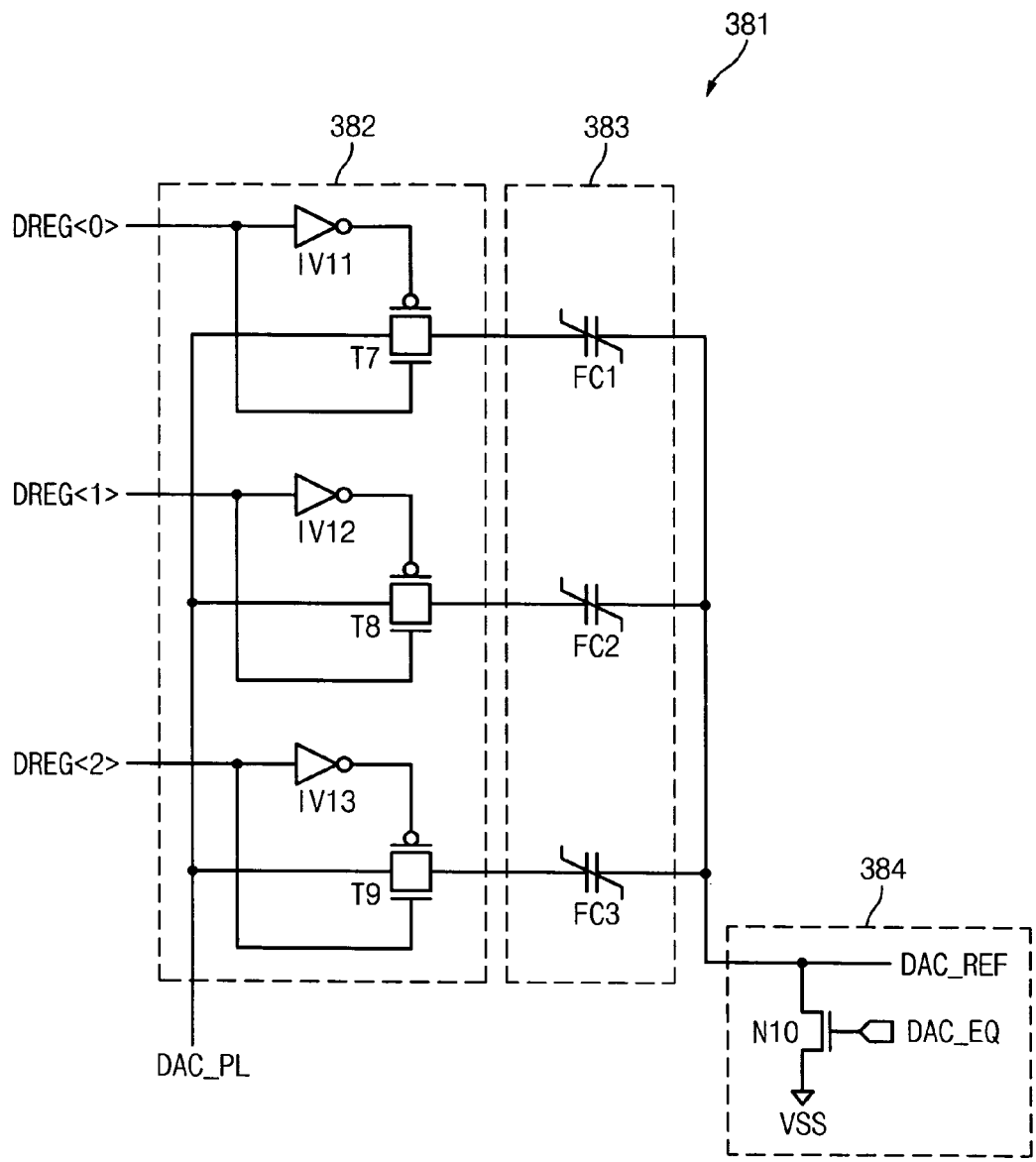
FIG. 18 is a circuit diagram of a reference level generator of FIG. 17.

FIG. 18 is a circuit diagram of the reference level generator 381 of FIG. 17.

The reference level generator 381 comprises a switching unit 382, a capacitor regulator 383 and a precharge controller 384.

The switching unit 382 comprises a plurality of inverters IV11~IV13, and a plurality of transmission switches T7~T9. The capacitor regulator 383 comprises a plurality of nonvolatile ferroelectric capacitors FC1~FC3. The precharge controller 384 comprises an NMOS transistor N10. The NMOS transistor N10, connected between a output terminal of the reference level signal DAC_REF and a ground voltage VCC terminal, has a gate to receive the equalizing signal DAC_EQ.

The inverters IV11~IV13 invert the data register signals DREG<0:2> applied from the data register array unit 303. The transmission gates T7~T9 selectively output the plateline control signal DAC_PL depending on the data register signals DREG<0:2>.

The nonvolatile ferroelectric capacitors FC1~FC3 control data voltage levels of the reference level signal DAC_REF by selectively regulating a size of a capacitor outputted in response to output signals applied from the transmission gates T7~T9.

In the precharge mode, the equalizing signal DAC_EQ becomes at a high level to turn on the NMOS transistor N10, thereby precharging the reference level signal DAC_REF to a low level.

Figure 19:
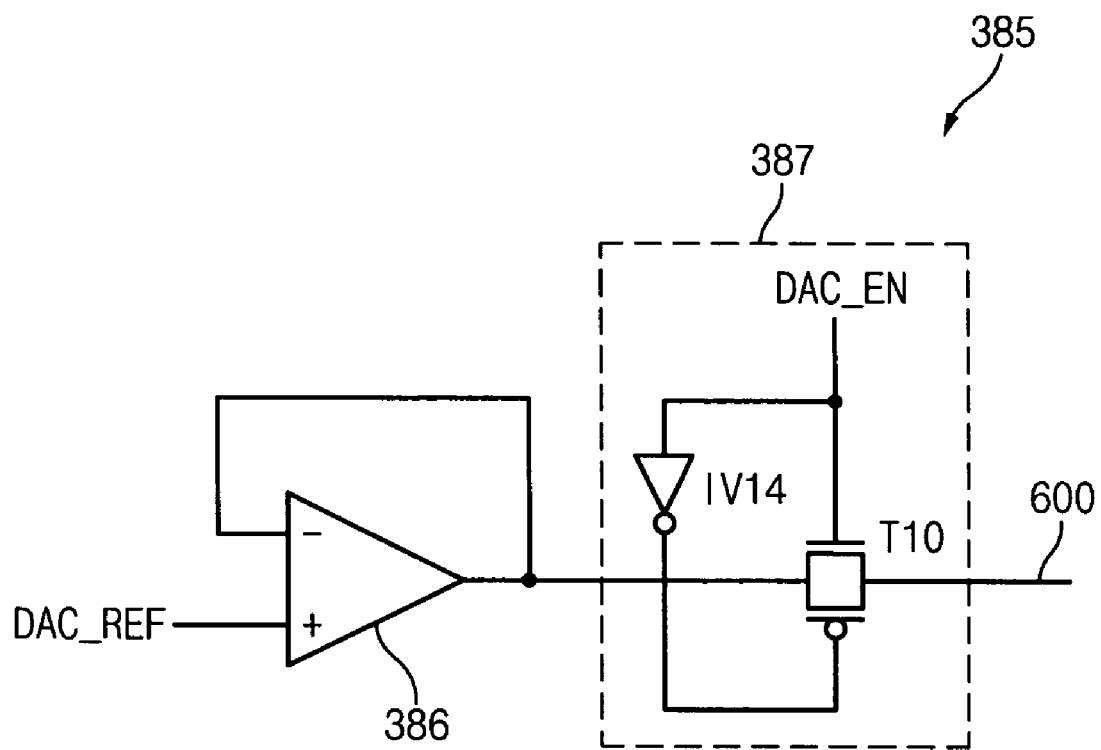
FIG. 19 is a circuit diagram of a write data bus driving unit of FIG. 17.

FIG. 19 is a circuit diagram of the write data bus driving unit 385 of FIG. 17.

The write data bus driving unit 385 comprises a buffer 386 and a driving unit 387. The buffer 386 amplifies a current driving capacity of the reference level signal DAC_REF. The voltage of the reference level signal DAC_REF is identical with a voltage outputted into the write data bus unit 600.

The driving unit 387 comprises an inverter IV14 and a transmission gate T10. The driving unit 387 selectively outputs an output signal from the buffer 386 into the write data bus unit 600 in response to the driving enable signal DAC_EN enabled in the write mode.

Figure 20:
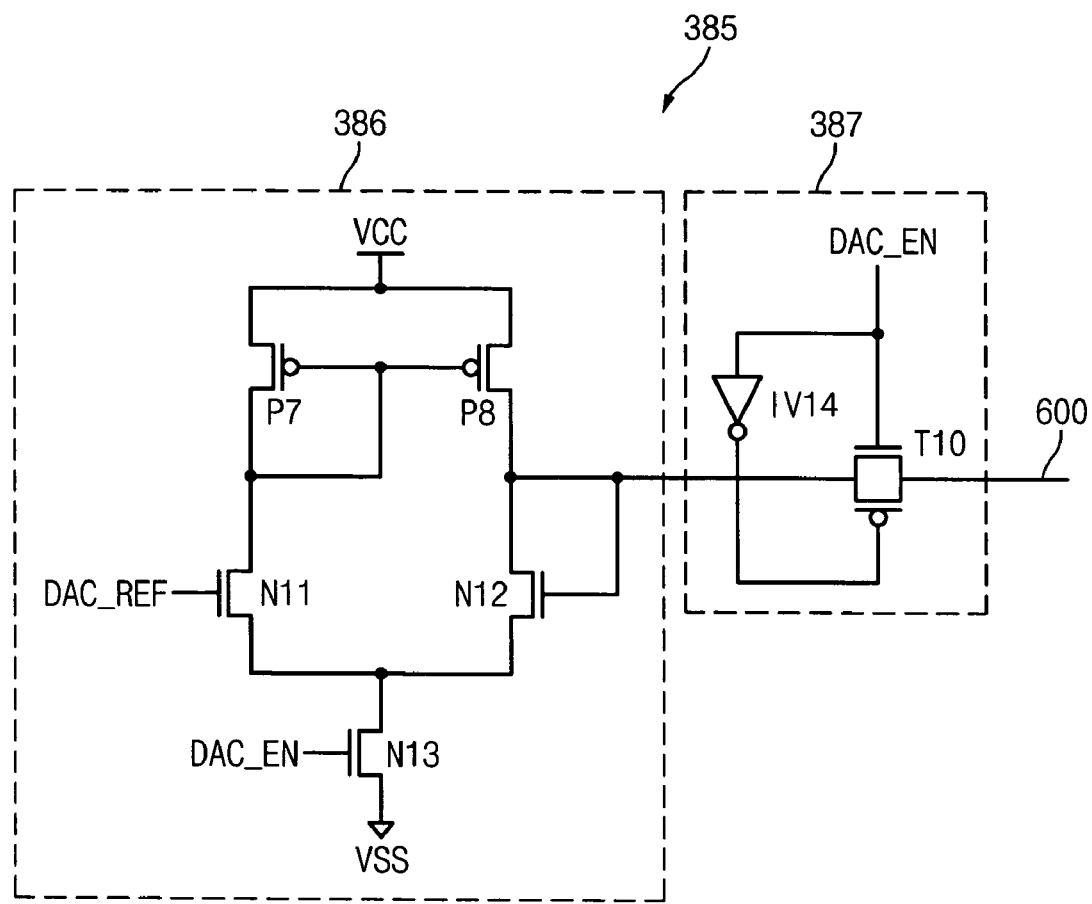
FIG. 20 is a circuit diagram of a buffer of FIG. 19.

FIG. 20 is a circuit diagram of the buffer 386 of FIG. 19.

The buffer 386 comprises PMOS transistors P7 and P8, and NMOS transistors N11~N13.

The PMOS transistors P7 and P8 have a common source to receive the power voltage VCC and a common gate connected to a drain of the NMOS transistor N11.

The NMOS transistor Nil, connected between the PMOS transistor P7 and the NMOS transistor N13, has a gate to receive the reference level signal DAC_REF. The NMOS transistor N12, connected between the PMOS transistor P8 and the NMOS transistor N13, has a gate connected to an output node. The NMOS transistor N13, connected between a common source of the NMOS transistors N11 and N12 and the ground voltage VSS terminal, has a gate to receive the driving enable signal DAC_EN.

Figure 21:
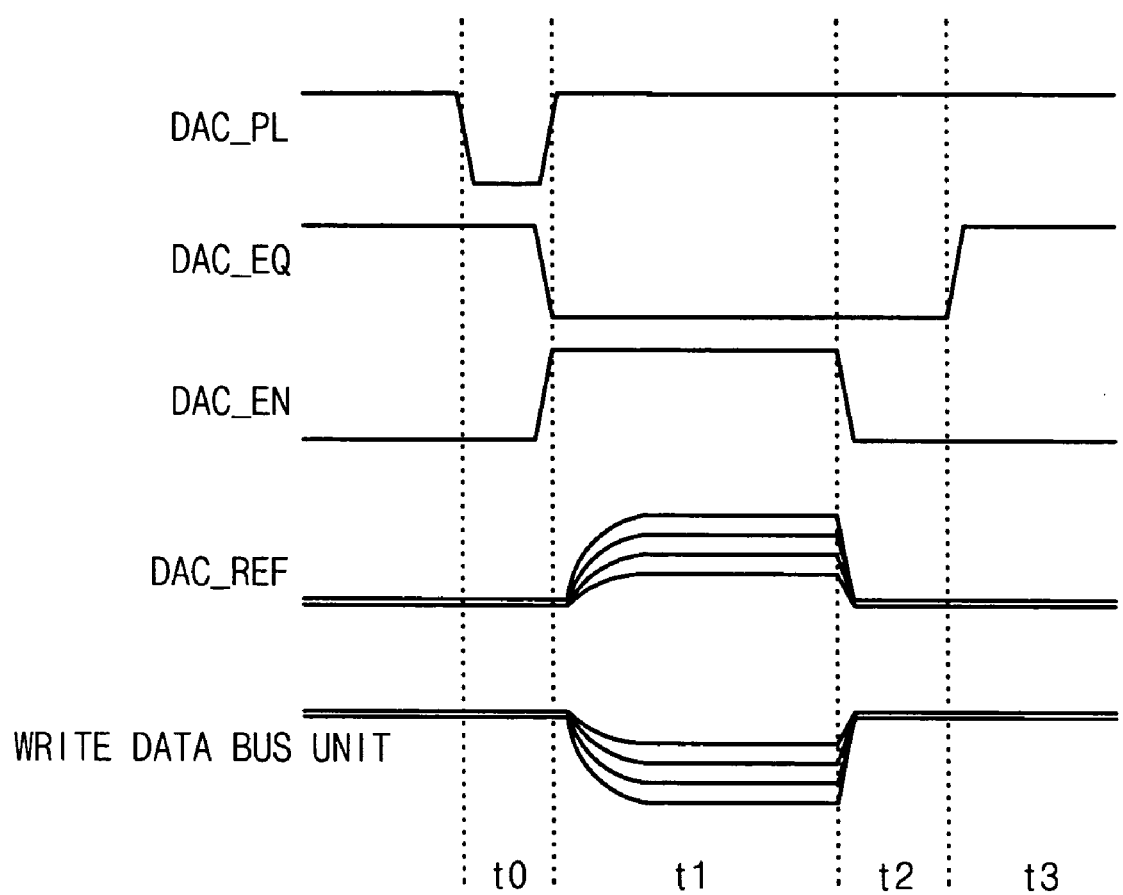
FIG. 21 is a timing diagram illustrating the operation of the D/A converter of FIG. 13.

FIG. 21 is a timing diagram illustrating the operation of the D/A converter 380 of FIG. 17.

The plateline control signal DAC_PL transits to a low level in an interval t0, and is maintained at a high level after an interval t1. As a result, noise charge of the capacitor regulator 383 is removed. The equalizing signal DAC_EQ becomes at a high level to initialize the capacitor regulator 383 to a low level.

When the interval t1 starts, the equalizing signal DAC_EQ transits to a low level. In order to write data in the cell array block 500 through the write data bus unit 600, the driving enable signal DAC_EN is enabled during the write mode of the interval t1. The voltage level of the reference level signal DAC_REF is determined in response to the plurality of data register signals DREF<0:2>.

When the plurality of data register signals DREG<0:2> are all at a high level, the voltage level of the plateline control signal DAC_PL is applied to the three nonvolatile ferroelectric capacitors FC1~FC3 of the capacitor regulator 383. In this case, the reference level signal DAC_REF is outputted with the highest voltage level.

On the other hand, when the plurality of data register signals DREG<0:2> are all at a low level, the voltage level of the plateline control signal DAC_PL is not applied to the three nonvolatile ferroelectric capacitors FC1~FC3 of the capacitor regulator 383. As a result, the reference level signal DAC_REF is outputted with the lowest voltage level. Since the write data bus unit 600 is precharged to a high level in the initial state, the reference level signal DAC_REF is written during the write mode.

Figure 22:
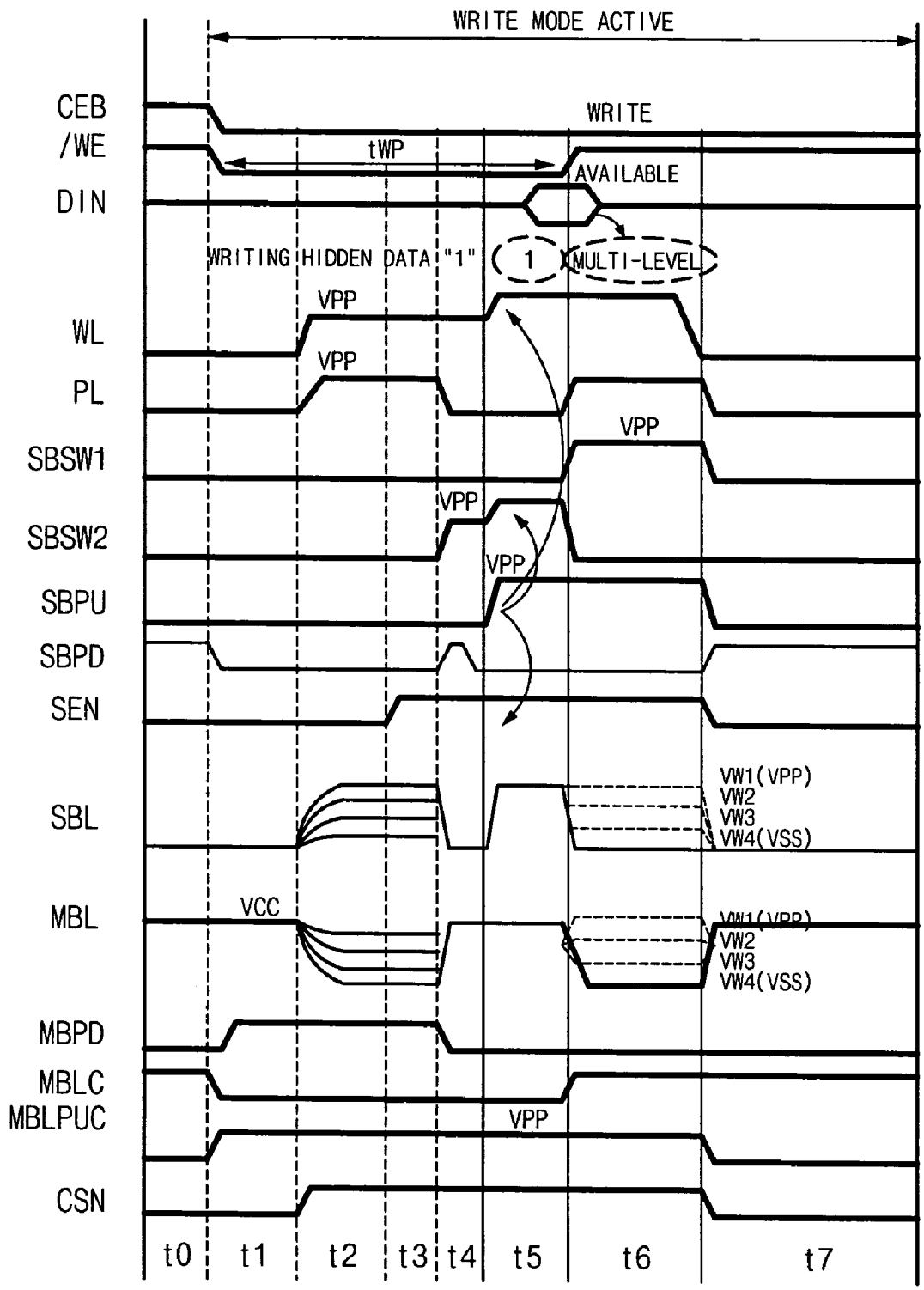
FIG. 22 is a timing diagram illustrating the write operation of the nonvolatile ferroelectric memory device having a multi-bit control function.

FIG. 22 is a timing diagram illustrating the write operation of the nonvolatile ferroelectric memory device having a multi-bit control function.

When the interval t1 starts, if the chip selecting signal CSB and a write enable signal /WE are disabled to a low level, the write operation becomes active. Here, the sub bitline pull-down signal SBPD and the main bitline control signal MBLC are disabled to a low level. The main bitline pull-up control signal MBLPUC is enabled to a high level.

Thereafter, when an interval t2 starts, if the wordline WL and the plateline PL are enabled to a pumping voltage VPP, the voltage level of the sub bitline SBL rises. Then, the column selecting signal CSN is enabled to connect the write data bus unit 600 to the main bitline MBL.

Next, when an interval t3, a data sensing interval, starts, the sense amplifier enable signal SEN is enabled to apply cell data to the main bitline MBL.

When an interval t4 starts, the plateline PL is disabled to a low level, and the sub bitline selecting signal SBSW2 is enabled to a high level. Here, the sub bitline pull-down signal SBPD is enabled to a high level, and the sub bitline SBL and the main bitline pull-down signal MBPD are disabled to a low level.

In an interval t5, hidden data "1" is written. When the interval t5 starts, the voltage of the wordline WL rises, and the sub bitline selecting signal SBSW2 is enabled to the pumping voltage VPP level in response to the sub bitline pull-up signal SBPU. As a result, the voltage level of the sub bitline SBL rises to the pumping voltage VPP level.

In an interval t6, multi-level data can be written in response to the write enable signal /WE. When the interval t6 starts, the plateline PL is enabled again. Then, the sub bitline selecting signal SBSW1 rises to the pumping voltage VPP level, and the sub bitline selecting signal SBSW2 is disabled. Here, the main bitline control signal MBLC is enabled to a high level.

Therefore, while the sub bitline selecting signal SBSW1 is at the pumping voltage VPP level, a plurality of data can be written in the memory cell depending on multi-voltages VW1~VW4 levels applied to the sub bitline SBL and the main bitline MBL.

When an interval t7 starts, the wordline WL, the plateline PL, the sub bitline selecting signal SBSW1 and the sub bitline pull-up signal SBPU are disabled. Then, the sub bitline pull-down signal SBPD is enabled, and the sense amplifier enable signal SEN is disabled. The main bitline pull-up control signal MBLPUC is disabled, and the main bitline MBL is precharged to the power voltage VCC level. Here, the column selecting signal CSN is disabled to disconnect the write data bus unit 600 to the main bitline MBL.

Figure 23:
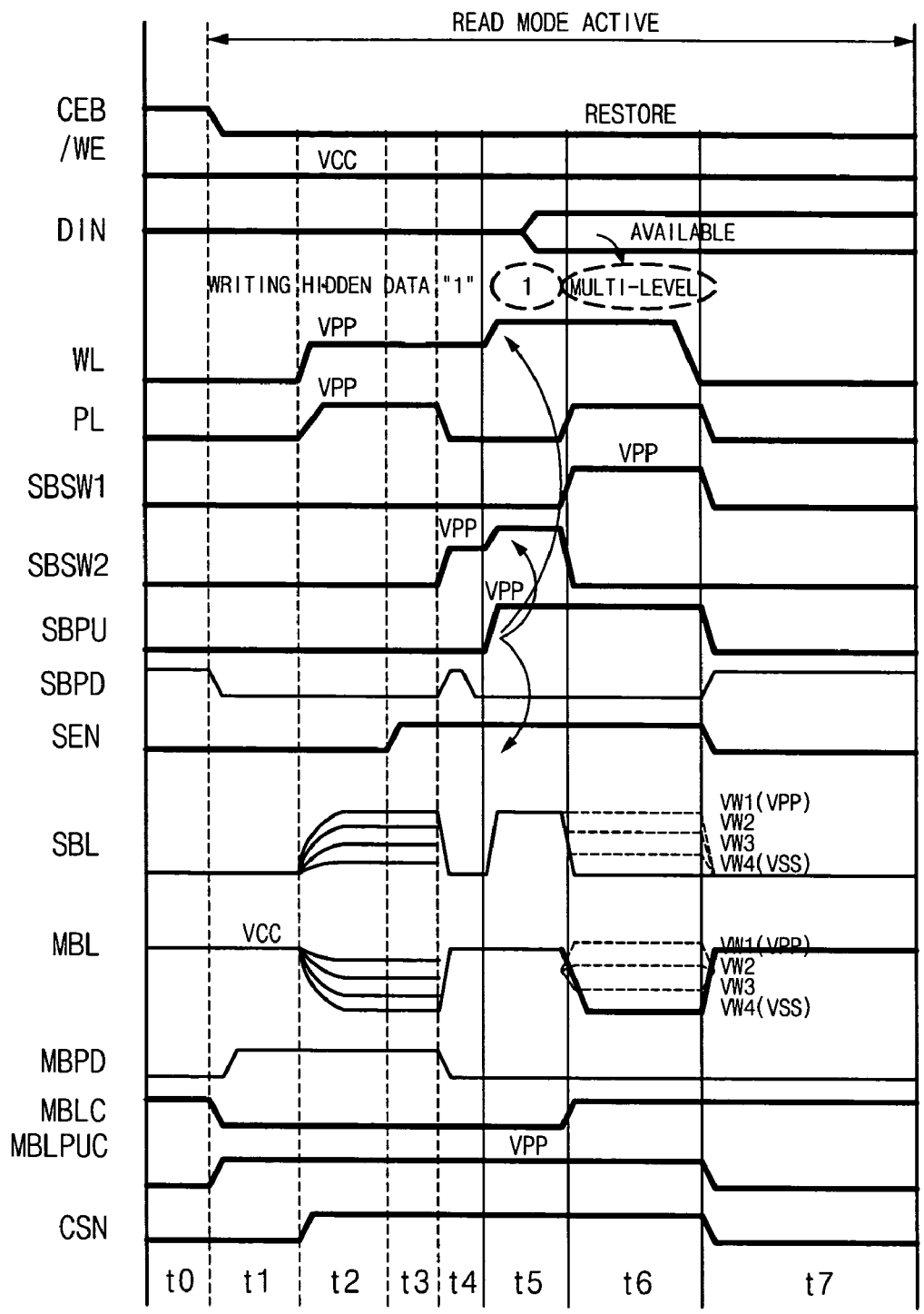
FIG. 23 is a timing diagram illustrating the read operation of the nonvolatile ferroelectric memory device having a multi-bit control function.

FIG. 23 is a timing diagram illustrating the read operation of the nonvolatile ferroelectric memory device having a multi-bit control function.

In the read mode, the write enable signal /WE is maintained at the power voltage VCC level. In the interval t2 and t3, data are sensed. In the interval t5, hidden data "1" is written, and a data output available interval is maintained after the interval t5.

The cell array block 500 does not write input data externally inputted through the timing data buffer unit 100 in the cell. Instead, the cell array block 500 restores read data stored in the read/write data register array unit 300 in the cell.

Thereafter, in the interval t6, a plurality of multiple level data are restored. That is, while the sub bitline selecting signal SBSW1 is at a high level, multiple levels of the voltages VW1~VW4 are applied to the sub bitline SBL and the main bitline MBL by a feedback decoder loop. As a result, the multiple levels are restored in the memory cell.

During the interval t6, a plurality of data levels stored in the cell array block 500 are sensed, and outputted through the read data bus unit 400.

As described above, in a nonvolatile ferroelectric memory device according to an embodiment of the present invention, a plurality of data levels are detected by differentiating timing of a reference timing strobe interval using a sensing critical voltage, and a plurality of data bits are stored in a cell, thereby improving the sensing margin. Since a plurality of read/written data are stored through a register, a chip having an improved access time can be obtained. In addition, a self-sensing voltage of cell data is amplified in a reference timing interval and a plurality of data voltage levels are determined on a basis of a time axis, thereby securing the margin of the sensing voltage and improving the operation speed.

What is claimed is:

1. A nonvolatile ferroelectric memory device having a multi-bit control function, comprising:
   a plurality of cell array blocks for amplifying sensing data levels induced to a main bitline in a reference timing strobe interval, wherein each of the plurality of cell array blocks comprises a nonvolatile ferroelectric memory;
   a read data bus unit, connected in common to the plurality of cell array blocks, for transmitting the sensing data levels;
   a read/write data register array unit for outputting a plurality of bit data corresponding to the sensing data levels when the sensing data levels transmitted from the read data bus unit are changed, and for converting a plurality of inputted bit data or the sensing data levels into analog reference level signals; and
   a write data bus unit, connected in common to the plurality of cell array blocks, for outputting the analog reference level signals into the plurality of cell array blocks.

2. The device according to claim 1, wherein each of the plurality of cell array blocks comprises:
   a sense amplifier array unit for detecting the sensing data levels in sensing critical voltage levels to output the detected levels into the read data bus unit;
   a main bitline pull-up controller for pulling up the main bitline in response to a main bitline pull-up control signal;
   a plurality of sub cell arrays each comprising the nonvolatile ferroelectric memory; and
   a write switch unit for selectively connecting the write data bus unit to the main bitline in response to a write switch control signal.

3. The device according to claim 2, wherein the sense amplifier unit comprises:
   a level sensing unit for comparing the critical value with a voltage level of the main bitline, and for sensing a voltage level of cell data in response to the comparison result when a sensing enable signal is activated; and
   a sensing output unit for determining a voltage level of the read data bus unit depending on an output voltage level of the level sensing unit when a sensing output enable signal is enabled.

4. The device according to claim 3, wherein the level sensing unit comprises:
   a first driver for precharging the main bitline to a power voltage when a main bitline control signal is activated;
   a second driver for outputting the power voltage to a first node when the sensing enable signal is disabled;

a third driver for outputting a voltage of the first node to an output node when a voltage of the main bitline is at a low level; and a fourth driver for outputting a ground voltage to the output node when the voltage of the main bitline is at a high level.

5. The device according to claim 4, wherein the sensing output unit comprises:

a fifth driver for outputting the ground voltage when the sensing output enable signal is activated; and a sixth driver for determining a voltage level of the read data bus unit depending on an output voltage of the level sensing unit.

6. The device according to claim 1, wherein the read/write data register array unit comprises:

a data register array unit for storing the sensing data level applied from the read data bus unit into a plurality of data registers when a plurality of read lock control signals having a predetermined time interval are activated, and for outputting a plurality of data register signals when a register enable signal is activated;

a decoder for decoding input data applied from a read/write data buffer unit through a data buffer bus unit, and for outputting a plurality of coding signals into the data register array unit;

an encoder for encoding the plurality of coding signals applied from the data register array unit, and for outputting the encoded signals into the data buffer bus unit; and a D/A converter for converting the plurality of data register signals into the analog reference level signals.

7. The device according to claim 6, wherein each of the plurality of data registers comprises:

a read bus pull-up unit for pulling up the read data bus unit from an initial state in response to a bus pull-up control signal;

a read bus switching unit for selectively outputting a sensing data level applied from the read data bus unit in response to a read lock control signal;

a data input switching unit for selectively outputting a coding signal applied from the data buffer bus unit in response to a write lock control signal;

a data latch unit for storing the sensing data level and the coding signal;

a data register switching unit for outputting the sensing data level stored in the data latch unit into the D/A converter as a data register signal in response to the register enable signal; and a data output switching unit for outputting the coding signal stored in the data latch unit into the data buffer bus unit in response to an output enable signal.

8. The device according to claim 6, wherein the D/A converter comprises:

a reference level generator for controlling a voltage level of the reference level signal by regulating a size of a nonvolatile ferroelectric capacitor depending on voltage levels of the plurality of data register signals; and a write data bus driving unit for buffering and driving the reference level signal in a write mode, and for outputting the buffered and driven signal into the write data bus unit.

9. The device according to claim 8, wherein the reference level generator comprises:

a switching unit for selectively outputting a plateline control signal depending on voltage levels of the plurality of data register signals;

a capacitor regulator for controlling a data voltage level of the reference level signal by selectively regulating the size of the capacitor in response to the plateline control signal, the regulator comprising a plurality of nonvolatile ferroelectric capacitors; and a precharge controller for precharging the reference level signal to a low level when an equalizing signal is enabled to a high level in a precharge mode.

10. The device according to claim 9, wherein the switching unit outputs the plateline control signal when the plurality of data register signals are inputted with a high level, and comprises a plurality of transmission gates corresponding to the number of the plurality of data register signals.

11. The device according to claim 8, wherein the write data bus driver comprises:

a buffer for amplifying and driving current of the reference level signal; and a driving unit for outputting an output signal from the buffer into the write data bus unit when a driving enable signal activated in the write mode is enabled.

12. The device according to claim 11, wherein the buffer comprises:

a first PMOS transistor and a second PMOS transistor having a common source to receive a power voltage and gates connected in common;

a first NMOS transistor having a drain connected to the common gate of the first PMOS transistor and the second PMOS transistor and a gate to receive the reference level signal;

a second NMOS transistor having a gate connected in common to the drain of the second PMOS transistor; and a third NMOS transistor, connected between a common source of the first NMOS transistor and the second NMOS transistor and a ground voltage terminal, having a gate to receive the driving enable signal.

13. The device according to claim 1, further comprising a read lock control signal generator for generating a plurality of read lock control signals having the predetermined time interval.

14. The device according to claim 13, wherein the read lock control signal generator comprises:

a plurality of lock delay controllers for delaying the read lock control signals each to have the predetermined time interval, and for outputting a plurality of output signals; and a plurality of lock driving buffer unit for driving the plurality of output signals, and for outputting a plurality of read lock control signals to have the predetermined time interval.

15. The device according to claim 14, wherein each of the plurality of lock delay controllers comprises:

a plurality of lock delay units for delaying the read lock control signals to have the predetermined time interval, and outputting output signals;

a plurality of FeRAM registers for programming a code on a preset command signal in a nonvolatile ferroelectric capacitor, and selectively outputting a plurality of control signals to control a switching state depending on the programmed code; and a plurality of transmission switching units for selectively controlling connection between the plurality of locks delay units in response to the plurality of control signals.

* * * * *